(12) United States Patent
Pettes et al.

(10) Patent No.: US 11,474,060 B2
(45) Date of Patent: Oct. 18, 2022

(54) INSTRUMENTS FOR MEASUREMENT OF MULTIPLE MATERIAL PROPERTIES

(71) Applicant: University of Connecticut, Farmington, CT (US)

(72) Inventors: Michael T. Pettes, Los Alamos, NM (US); Hyun-Young Kim, Pittsburgh, PA (US); Sajad Yazdani, Hamden, CT (US)

(73) Assignee: UNIVERSITY OF CONNECTICUT, Farmington, CT (US)

( * ) Notice: Subject to any disclaimer, the term of this patent is extended or adjusted under 35 U.S.C. 154(b) by 335 days.

(21) Appl. No.: 16/640,715

(22) PCT Filed: Sep. 4, 2018

(86) PCT No.: PCT/US2018/049427
§ 371 (c)(1),
(2) Date: Feb. 20, 2020

(87) PCT Pub. No.: WO2019/050876
PCT Pub. Date: Mar. 14, 2019

(65) Prior Publication Data
US 2020/0182815 A1 Jun. 11, 2020

Related U.S. Application Data

(60) Provisional application No. 62/554,432, filed on Sep. 5, 2017.

(51) Int. Cl.
*G01N 27/04* (2006.01)
*G01N 25/18* (2006.01)
*G01K 7/02* (2021.01)

(52) U.S. Cl.
CPC .............. *G01N 27/04* (2013.01); *G01K 7/02* (2013.01); *G01N 25/18* (2013.01)

(58) Field of Classification Search
CPC ........ G01R 27/00; G01R 27/02; G01N 27/00; G01N 27/02; G01N 27/04; G01N 25/00; G01N 25/18; G01K 7/00; G01K 7/02
(Continued)

(56) References Cited

U.S. PATENT DOCUMENTS 3,733,887 A    5/1973  Stanley et al.
2010/0147348 A1* 6/2010  Backhaus-Ricoult ......................
                                              C04B 35/58014
                                              136/201

(Continued)

FOREIGN PATENT DOCUMENTS

CN    107085007 B  *  7/2019  ............. G01N 25/20

OTHER PUBLICATIONS

Iwanaga et al: Review of Scientific Instruments 82, 063905 "A high temperature apparatus for measurement of the seebeck coefficient" Jun. 30, 2011 (Jun. 6, 2011), pp. 1-6.

(Continued)

*Primary Examiner* — Hoai-An D. Nguyen
(74) *Attorney, Agent, or Firm* — Casimir Jones SC; Lisa Mueller

(57) ABSTRACT

A device for measuring a plurality of material properties includes a structure and sensors in the structure configured to sense at least thermal conductivity, electrical conductivity, and Seebeck coefficient for a single sample consecutively while maintaining a vacuum or inert gas environment. Embodiments can also measure ionic conductivity and/or surface temperatures. Embodiments can measure any suitable plurality of the above properties.

9 Claims, 24 Drawing Sheets

(58) Field of Classification Search
USPC .............................. 324/600, 649, 691, 693
See application file for complete search history.

(56) References Cited

U.S. PATENT DOCUMENTS

2012/0213250 A1     8/2012  Snyder
2017/0179363 A1*    6/2017  Hayashi ................ C01B 32/159

OTHER PUBLICATIONS

Vasilevskiy, et al. "System for simultaneous harman-based measurement of all thermoelectric properties", from 240 to 720 k, by use of a novel calibration procedure. Journal of Electronic Materials 44.6 (Jun. 1, 2015): 1733-1742. Abstract, p. 1733 para 1, p. 1734 col. 2 para 5, p. 1735 col. 1 para 1, p. 1737 col. 1 para 4-5, p. 1737 col. 2, para 1-2, p. 1738 col. 1 para 3, p. 1738 col. 2 para 4, p. 1740 col. 2, para 3, Figure 1.

Kraemer et al. "A simple differential steady-state method to measure the thermal conductivity of solid bulk materials with high accuracy." Review of Scientific Instruments 85.2 (Feb. 2014): 025108. p. 1 col. 2 para 1, p. 2 col. 2 para 2, p. 4 col. 1 para 1, Figure 2, Figure 3.

Bottger et al. "High temperature Seebeck coefficient and resistance measurement system for thermoelectric materials in the thin disk geometry." Review of Scientific Instruments 83.2 (Feb. 2, 2012): 025101. Abstract, (p. 3 col. 2 para 4), (p. 4 col. 1 para 2), (p. 4 col. 1 para 5), Figure 1.

Zhou et al. "Apparatus for Seebeck coefficient and electrical resistivity measurements of bulk thermoelectric materials at high temperature." Review of scientific instruments 76.2 (Jan. 5, 2005): 023901. Entire Document.

International search report and written opinion issued in corresponding PCT Application No. PCT/US18/49427, dated Dec. 7, 2018.

* cited by examiner

US 11,474,060 B2

INSTRUMENTS FOR MEASUREMENT OF MULTIPLE MATERIAL PROPERTIES

CROSS-REFERENCE TO RELATED APPLICATIONS

This application is a U.S. National Stage Entry of International Application no. PCT/US2018/049427, filed on Sep. 4, 2018, which claims priority to and the benefit of U.S. Provisional Application No. 62/554,432, filed Sep. 5, 2017, the contents of each being incorporated herein by reference in their entirety.

BACKGROUND

1. Field

The present disclosure relates to instruments for measurement of multiple material properties (e.g., for measurement of Seebeck coefficient).

2. Description of Related Art

Obtaining accurate knowledge of electrical and thermal properties of manufactured materials has significantly broad implications in various industries as these properties are fundamental to any material system, which affects quality control aspects needed for the integrity of cyber-physical and energy systems engineering.

Thermal energy harvesters are based on the Seebeck effect. The Seebeck effect is a phenomenon in which a temperature difference between two dissimilar electrical conductors or semiconductors produces a voltage difference between the two substances. Currently separate instruments are required to make all necessary measurements of materials and prototypes to understand the Seebeck coefficient thereof.

Electrochemical energy storage devices are based on changes in chemical potential during a reduction/oxidation reaction, with the rate of charge and discharge limited by ionic conductivity. Energy dissipation is mainly due to Joule heating in the device, where charge flow between anode and cathode is impeded by the resistance of the separating medium. Currently different instruments are used to measure the electrochemical performance of fabricated cells and packs with limited ability to obtain temperature dependent performance and surface temperature during operation.

Such conventional methods and systems have generally been considered satisfactory for their intended purpose. However, there is still a need in the art for improved instruments for characterization of material properties. The present disclosure provides a solution for this need.

SUMMARY

A device for measuring a plurality of material properties includes a structure and sensors in the structure configured to sense at least thermal conductivity, electrical conductivity, and Seebeck coefficient for a single sample consecutively while maintaining a vacuum or inert gas environment. Embodiments can also measure ionic conductivity and/or surface temperatures. Embodiments can measure any suitable plurality of the above properties.

A method can include measuring thermal conductivity, electrical conductivity, and Seebeck coefficient and/or ionic conductivity, and/or surface temperatures of a sample consecutively without using multiple instruments and without moving the sample. Measured thermovoltage and Seebeck coefficient of a reference sample can be used to determine a calibration coefficient linking a thermocouple probe temperature to the intrinsic temperature at a top of the sample.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1A:
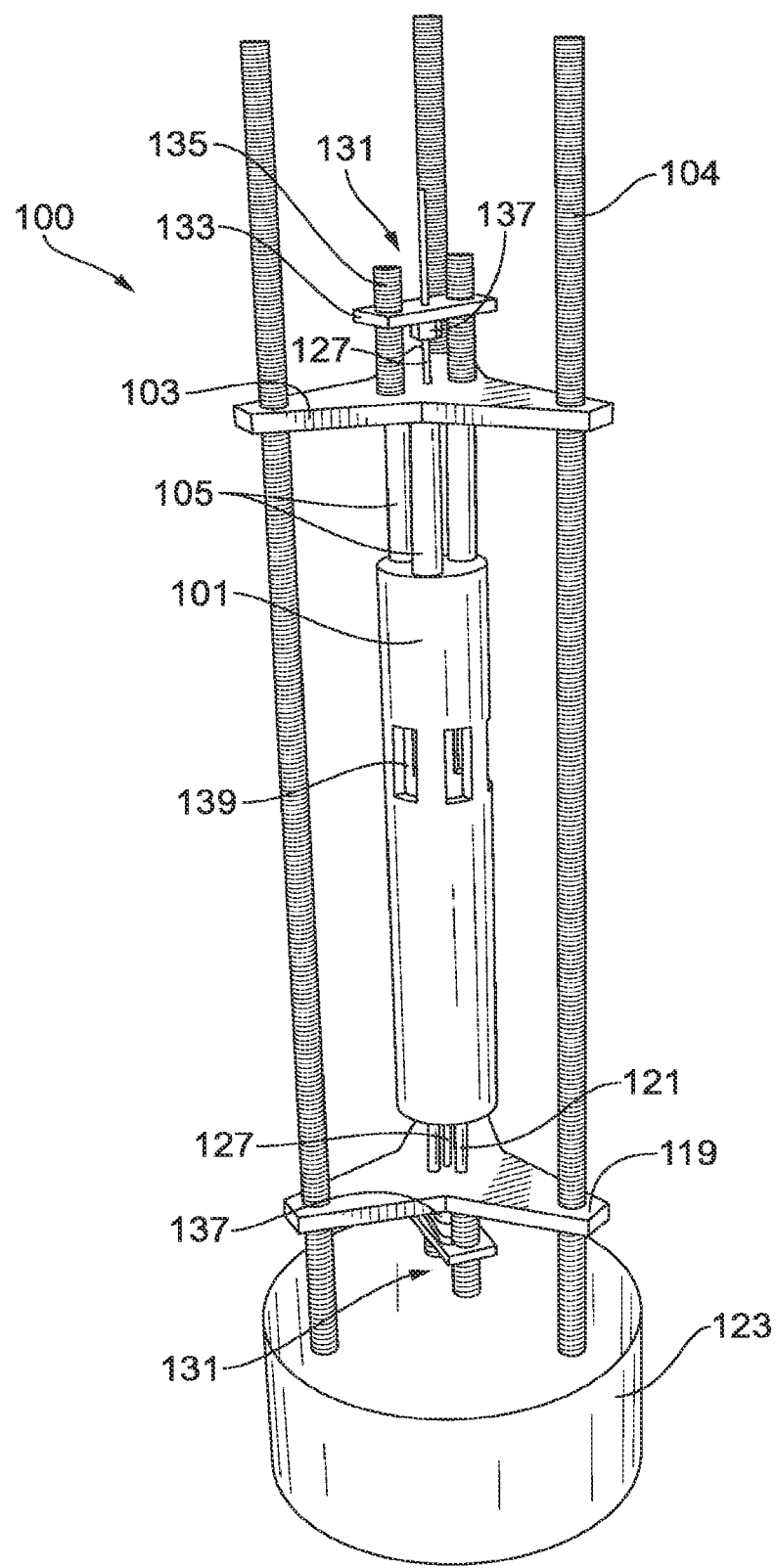
FIG. 1A is a perspective view of an embodiment of an instrument in accordance with this disclosure.

Reference will now be made to the drawings wherein like reference numerals identify similar structural features or aspects of the subject disclosure. For purposes of explanation and illustration, and not limitation, an illustrative view of an embodiment of an instrument in accordance with the disclosure is shown in FIG. 1A. Other embodiments and/or aspects of this disclosure are shown in other FIGS. 1B-27.

As used herein, "around", "about" or "approximately" shall generally mean within 20 percent, preferably within 10 percent, and more preferably within 5 percent of a given value or range. Numerical quantities given herein can be exact or can be approximate, meaning that the term "around," "about," or "approximately" is hereby applied to all numerical values disclosed if not expressly stated.

Referring to FIGS. 1A-1J, an embodiment of an instrument 100 in accordance with this disclosure is shown. The instrument 100 can include a thermal guard 101 that can be attached to or separate from a first plate 103. The first plate 103 can be removably mounted to a structure (e.g., slidably mounted to supports 104).

The thermal guard 101 can have a hollow cylindrical shape defining a cavity therein. The thermal guard 101 can be made of metal (e.g., aluminum, steel, or any other suitable metal) or any other suitable material.

The thermal guard 101 can be mounted (e.g., rigidly or otherwise) to the first plate 103, e.g., via one or more (e.g., three as shown) posts 105. The one or more posts 105 can be rigidly mounted or can be spring loaded to exert a force between the first plate 103 and the thermal guard 101. The one or more posts 105 can be hollow (e.g., thin walled as shown in FIGS. 1A-1J which can aid in heat isolation), or solid. In certain embodiments, the one or more posts 105 may not be attached to the thermal guard 101 and may only rest on (via gravity) or push on (e.g., via spring force) the thermal guard 101 when assembled.

Figure 1B:
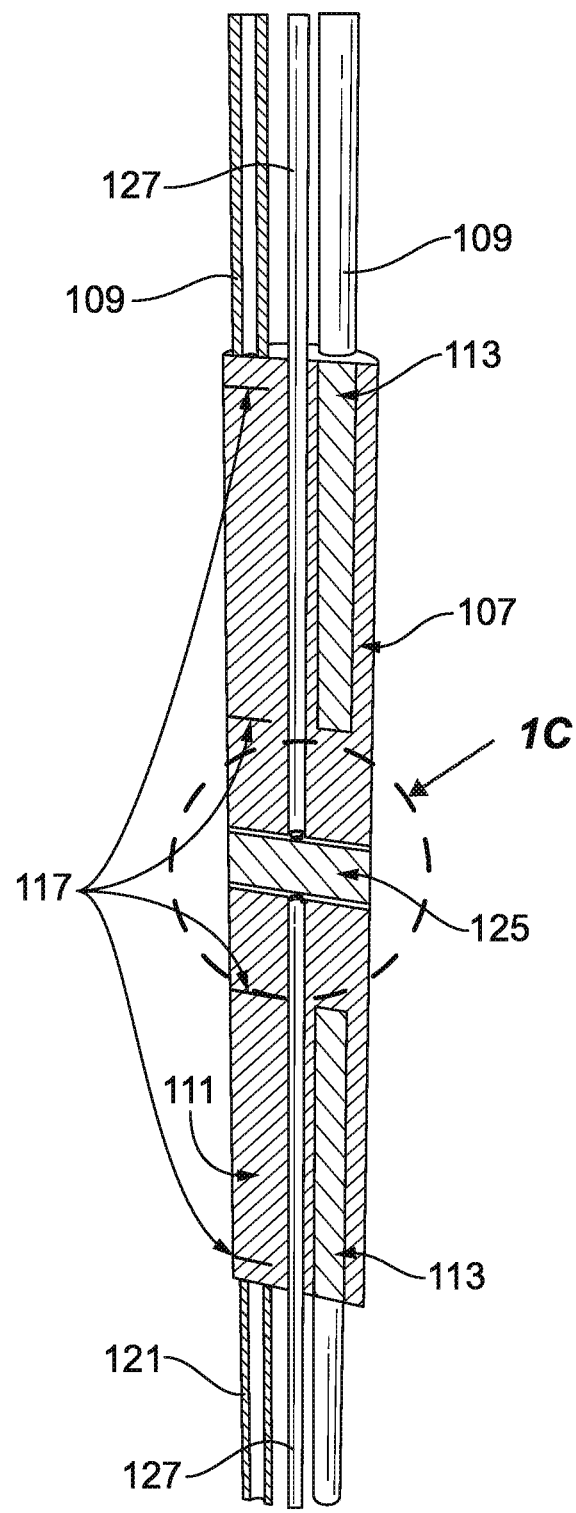
FIG. 1B is a partial, cross-sectional view of the embodiment of FIG. 1A.

Referring additionally to FIG. 1B, the instrument 100 can include a first heat spreader 107 within the thermal guard 101 in the cavity thereof. The first heat spreader 107 can be made of metal, for example, or any other suitable material. In certain embodiments, the first heat spreader 107 can be attached to the thermal guard 101 in any suitable manner, e.g., via one or more spreader posts 109 (e.g., rigidly or in a spring loaded configuration). The one or more spreader posts 109 can be the one or more posts 105 extending through the thermal guard 101. In certain embodiments, the one or more spreader posts 109 can be separate from the one or more posts 105 and can connect to the thermal guard 101 within the cavity of the thermal guard 101. In certain embodiments, the one or more spreader posts 109 may only be connected to one of the thermal guard 101 or the first spreader 107.

The one or more spreader posts 109 can be hollow (e.g., thin walled) to reduce heat transference through the one or more spreader posts 109. The one or more spreader posts 109 can be made of any suitable material (e.g., alumina, ceramic, high heat alloy). Any other suitable configuration (e.g., solid) is contemplated herein.

Figure 1C:
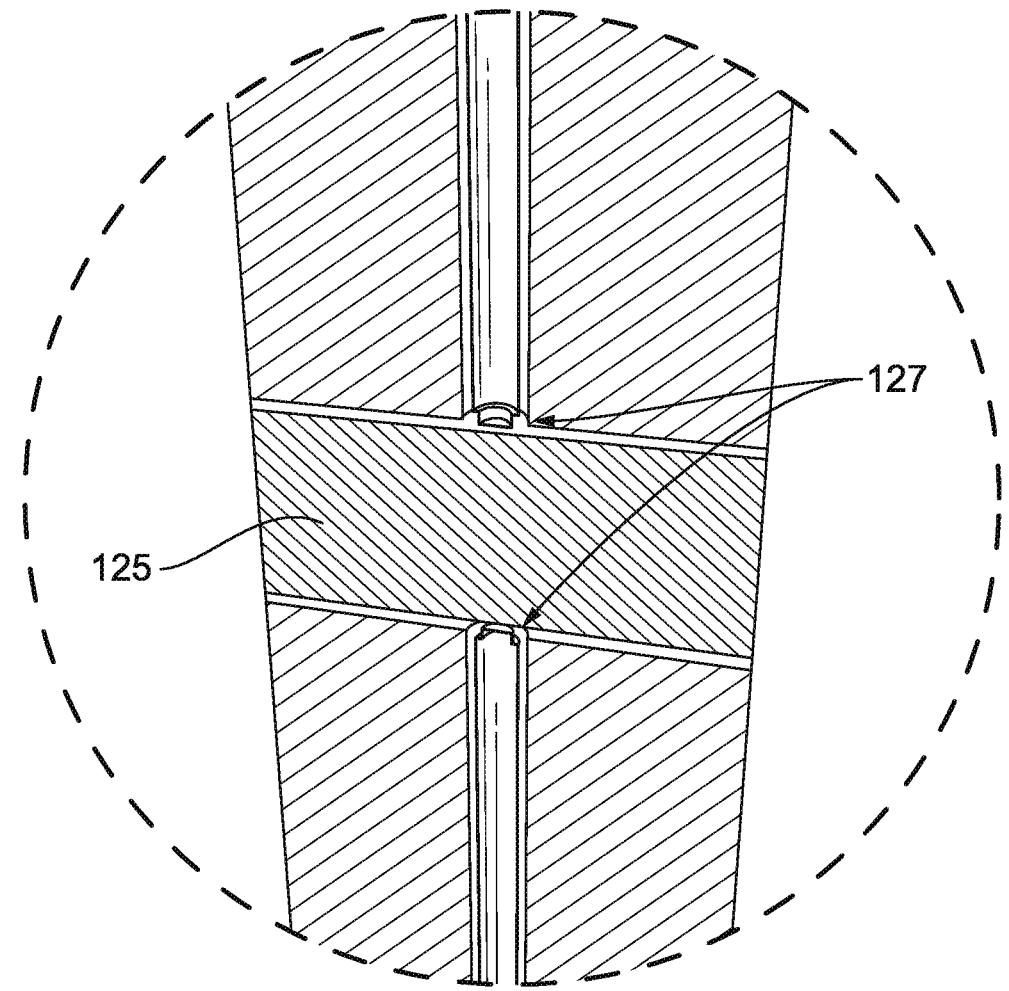
FIG. 1C is a close up of a partial cross-sectional view of FIG. 1B
Figure 1D:
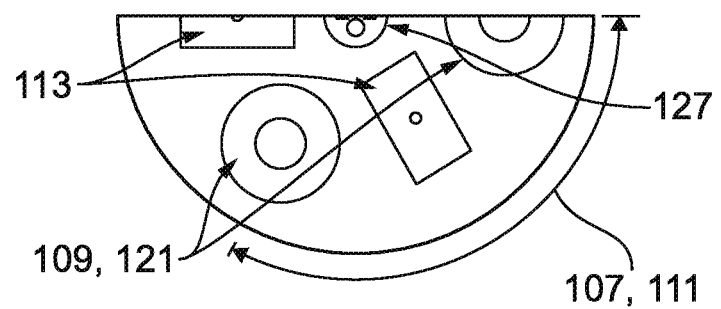
FIG. 1D is a partial top down view of an embodiment of a heat spreader in accordance with this disclosure.
Figure 1E:
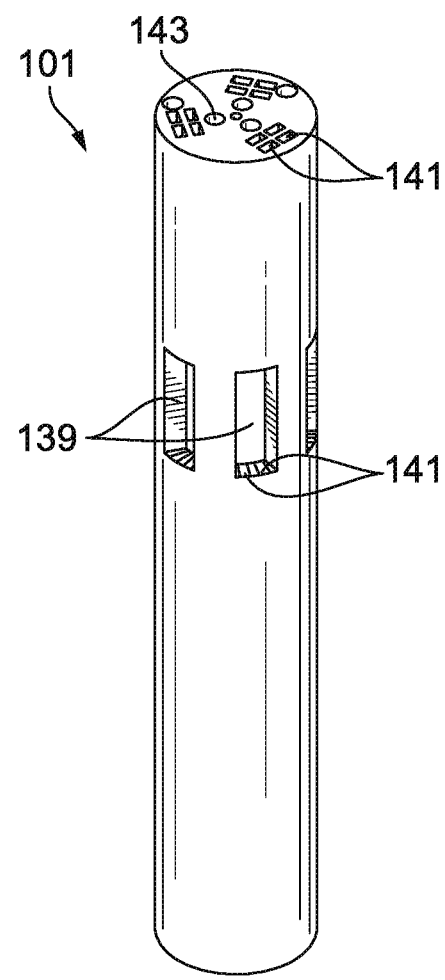
FIG. 1E is a perspective view of an embodiment of a thermal guard in accordance with this disclosure.
Figure 1F:
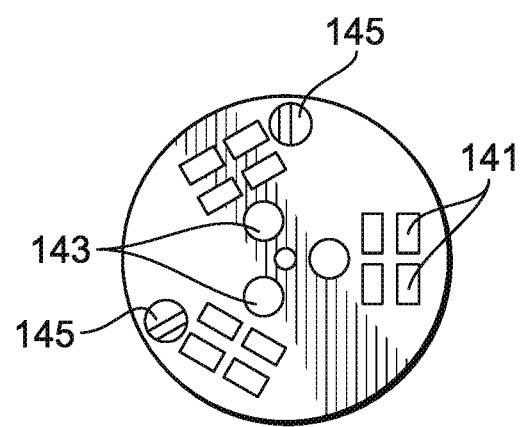
FIG. 1F is a plan view of a top of the thermal guard of FIG. 1E.
Figure 1G:
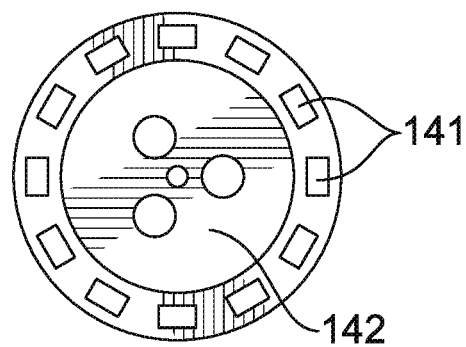
FIG. 1G is a plan view of a bottom of the thermal guard of FIG. 1F.
Figure 1H:
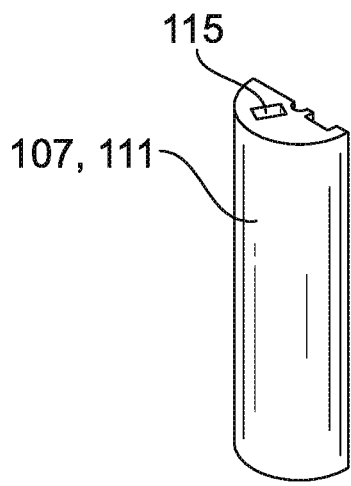
FIG. 1H is a perspective view of a section of an embodiment of a heat spreader in accordance with this disclosure.
Figure 1I:
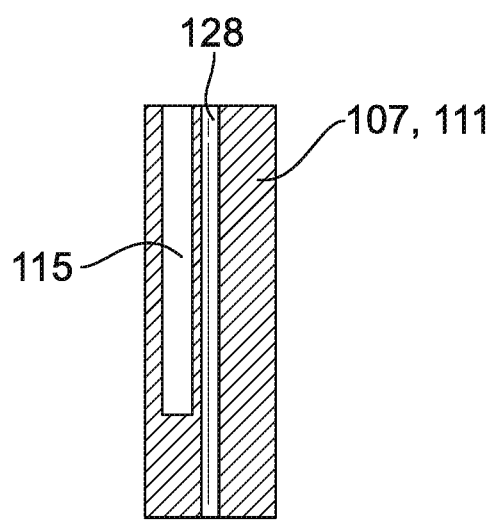
FIG. 1I is an elevation cross-sectional view of the heat spreader of FIG. 1H.

The first heat spreader 107 can include one or more heaters 113 disposed at least partially within the first heat spreader 107, e.g., within a heater pocket 115 (e.g., as shown in FIGS. 1H and 1I). The one or more heaters 113 can be any suitable heater (e.g., a resistive heater) and can be connected to an energy source in any suitable manner (e.g., by a wire filament extending up through the thermal guard 101, in a sheath (e.g., within a post 105, 109) or otherwise). The one or more heaters 113 can be retained within a respective heater pocket 115 in any suitable manner (e.g., with a set screw, by gravity, by brazing, etc.)

In certain embodiments, the first heat spreader 107 can include one or more thermocouples 117 disposed within the first heat spreader 107 (e.g., in a thermocouple pocket defined therein). Any suitable location for thermocouples is contemplated herein (e.g., one near a top and near a bottom of the heat spreader 107).

The instrument 100 can include a second heat spreader 111, e.g., at least partially within the heat guard 101 when assembled as shown in FIG. 1A. The second heat spreader 111 can be the same as and/or similar to the first heat spreader 107. Any other suitable design for the second heat spreader 111 is contemplated herein.

The second heat spreader 111 can be mounted to a second plate 119, e.g., via one or more spreader posts 121. The one or more spreader posts 121 can be the same as and/or similar to the one or more spreader posts 109. Any other suitable structure is contemplated herein. The second plate 119 can be the same as and/or similar to the first plate 103, and can be mounted to the support structure (e.g., support posts 105) the same and/or similarly to the first plate 103. Any other suitable design for the second plate 119 or mounting is contemplated herein.

As shown in FIG. 1A, the support structure (e.g., support posts 104) can be mounted to a base 123. The base 123 can be an actively cooled heat sink in certain embodiments. The second plate 119 can be mounted to be separated from the base 123 in any suitable manner.

The first and second heat spreaders 107, 111 are configured to retain a sample 125 there between when assembled. The sample 125 can be a disk shape as shown or any other suitable shape. In certain embodiments, the sample 125 can include a thermal interface material or atomic diffusion barrier (such as grafoil) surface on each side.

Referring additionally to FIG. 1C, certain embodiments of the instrument 100 can include at least two axial thermocouple 127, one extending through each heat spreader 107, 111, e.g., through a center hole 128 defined in each heat spreader 107, 111, to contact the sample. The thermocouples 127 can be slidably mounted relative to the heat spreaders 107, 111, the thermal guard 101, and the plates 103, 119, for example.

Each thermocouple 127 can pass through each plate 103, 119 and mount to a thermocouple mounting structure 131 attached to each plate 103, 119. In certain embodiments, each mounting structure 131 can include a platform 133 mounted to each plate 103, 119, e.g., via platform posts 135. In certain embodiments, a collar 137 can be mounted to each thermocouple 127 (e.g., via a set screw) and can applies a force to each thermocouple 127. For example, a spring (not shown in FIG. 1A) can be disposed between the collar 137 and the platform 133 to push the thermocouple 127 against the sample 125.

Figure 4:
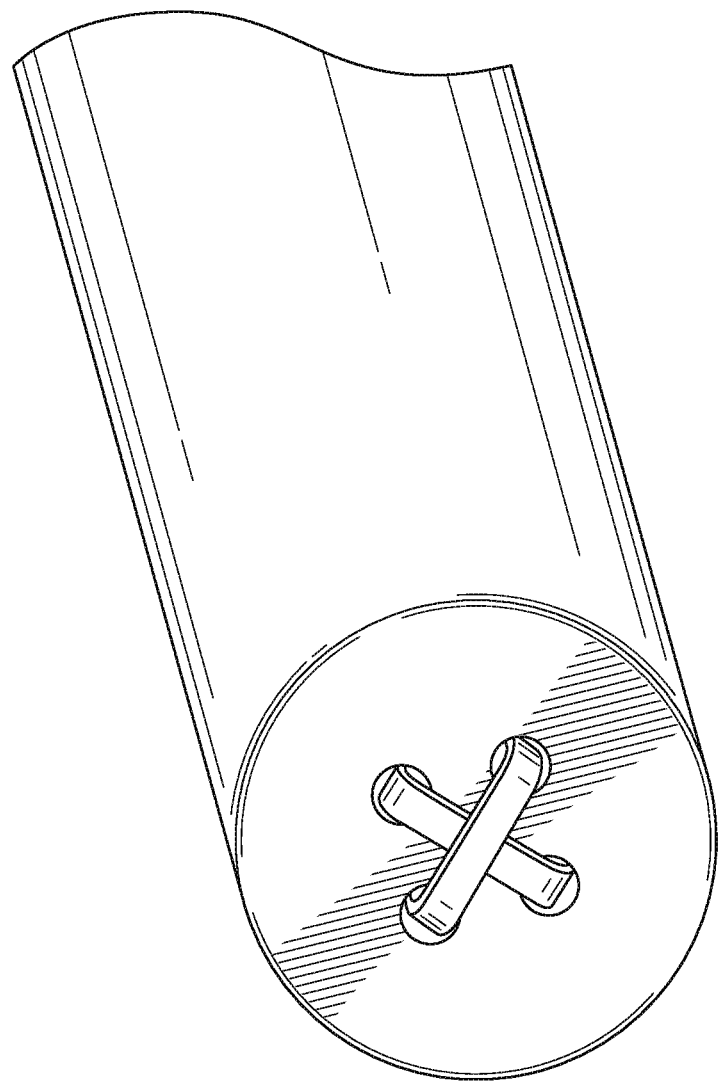
FIG. 4 shows a tip of the axially-inserted thermocouple and its cross geometry.

As shown in FIGS. 1C and 1D, each thermocouple 127 can include a sheath having one or more channels (e.g., four) for a plurality of wires to pass through. For example, an embodiment of a four channel thermocouple having crisscrossing wires at the tip is shown in FIG. 4.

Referring additionally to FIGS. 1E, 1F, and 1G, the thermal guard 101 can include one or more windows 139 (e.g., for access when assembled). The thermal guard 101 can also include one or more heater cavities 141 defined in the thermal guard 101 for receiving a heater 113 or any other suitable type of heater.

The one or more heater cavities 141 can be defined in any suitable location (e.g., to distribute heat evenly) and in any suitable pattern (e.g., axially and in groups of four on top, axially and in a single circular pattern around a bottom rim open to cavity 142). In certain embodiments, one or more heater cavities 141 can be defined in the window 139 as shown (e.g., in the sill of each window 139).

The thermal guard 101 can also include one or more post holes 143 for passing and/or connecting to spreader posts 109, one or more electrical access holes 145 (e.g., for wires from heat spreaders to pass through) and a thermocouple hole 147 for passing the thermocouple 127 on a top surface thereof, e.g., as shown in FIG. 1F. Any other suitable configurations to perform any suitable desired function is contemplated herein.

Figure 1J:
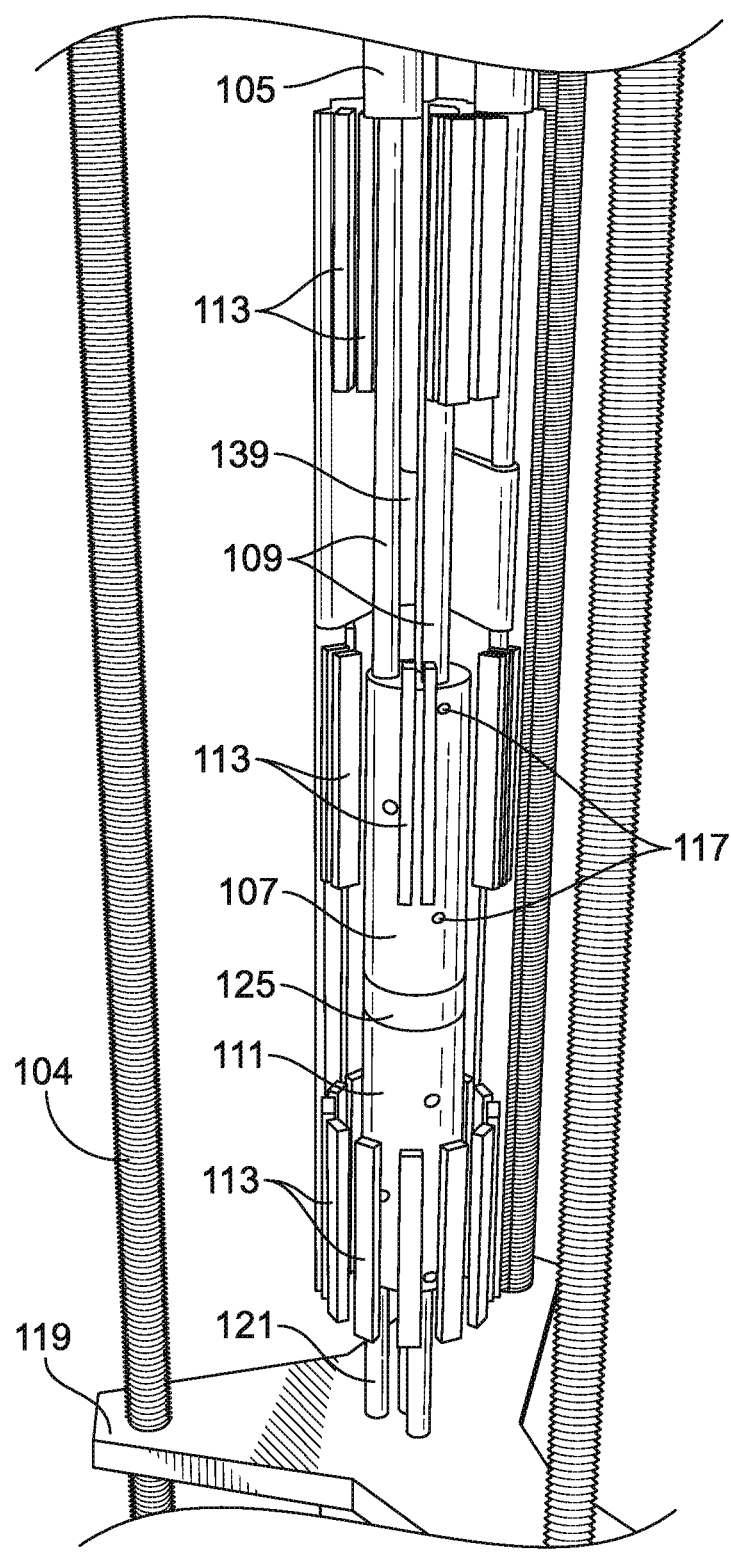
FIG. 1J is a perspective view of the instrument of FIG. 1A, shown assembled, having part of the thermal guard removed to show the entire assembly when assembled.

As shown, embodiments can include multiple heat application zones to the thermal guard 101 (e.g., top, middle, and bottom). A perspective view of the instrument with the thermal guard 101 partially removed to reveal heaters 113 disposed therein and the heat spreaders 107, 111 disposed therein is shown in FIG. 1J.

Figure 2:
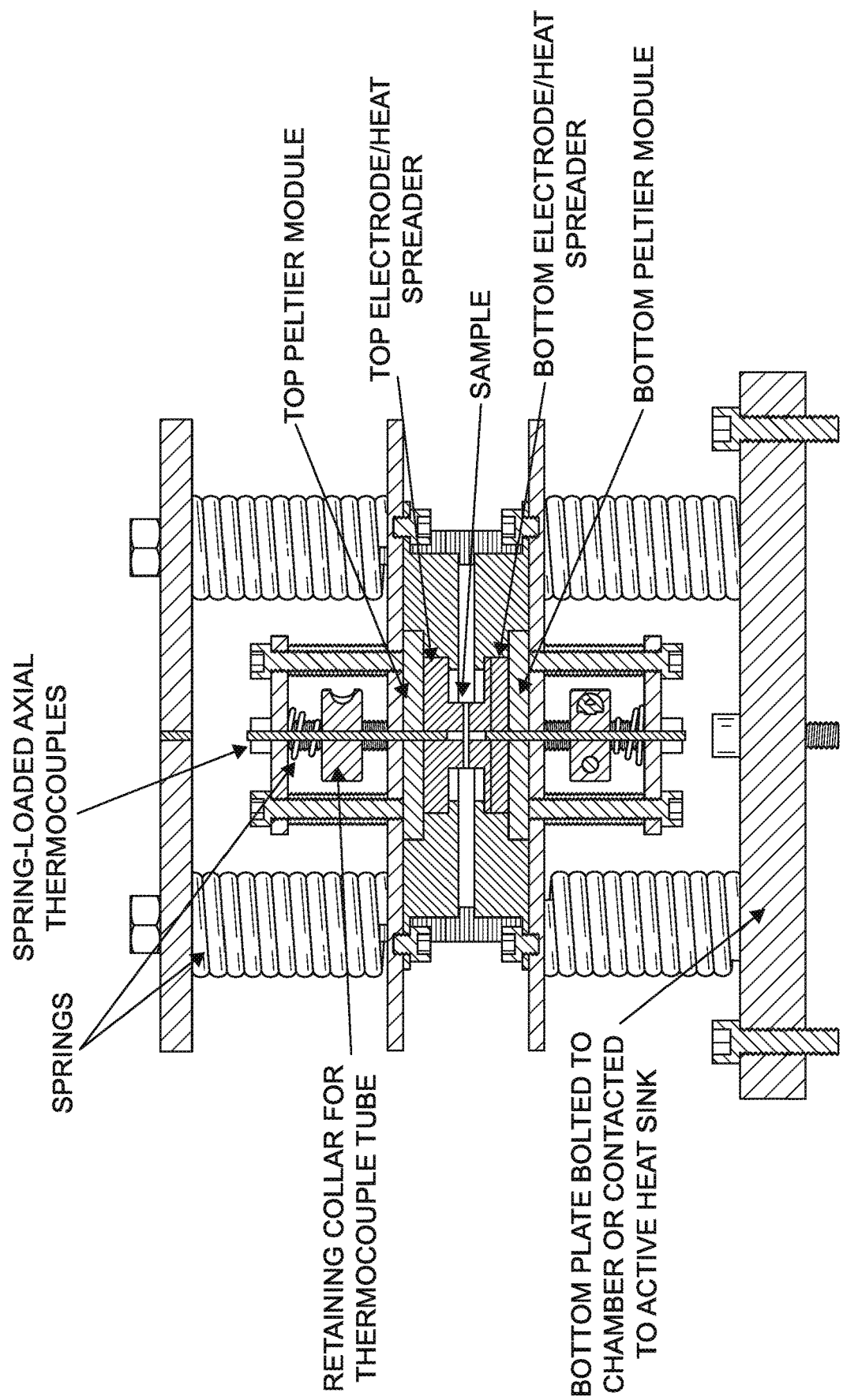
FIG. 2 shows a schematic, cross-sectional view of another embodiment of an instrument in accordance with this disclosure.

Another schematic embodiment of an instrument in accordance with this disclosure is shown in FIG. 2. Any suitable alternate configurations are contemplated herein.

Rigorous measurement of the battery operating parameters and performance (ionic conductivity, capacity, and surface temperature rise during fast charging) is imperative to determine the quality of a product or the propriety of newly developed ionic superconductors. Such measurements must be conducted at various temperatures as batteries are required to operate at cold or hot environments depending on the specific application. Developing such instruments is critical as the market for Li-based batteries is expected to reach at a minimum S14.3B by 2020. Currently, TSC battery cells from rhd Instruments GmbH & Co. KG are available for the measurements of dc-ionic conductivities. The instrument consists of a sealed cell performing measurements of the ionic conductivity of a single pellet-shaped electrolyte up to 100° C. This cell is not capable of thermal conductivity measurements which is essential for thermal management of electrochemical energy storage systems. The temperature range of only up to 100° C. limits its use for high temperature applications. Embodiments disclosed herein overcome the technical challenges regarding high temperature measurements and are capable of performing to 2500° C., characterizing the thermal, electrical and ionic conductivities simultaneously, for example. These challenges include providing firm contact between the electrodes and the samples, preventing any undesired chemical reaction and radiation. The surface temperature of the top and bottom sides of the electrolytes are detected by two thermocouples spring-loaded against the sample. Embodiments allow for measurements of the electrical and ionic conductivities using the four-probe techniques which is more accurate than those of two-probe techniques, allowing designs for large-scale measurements of electrolytes in an manufacturing production line.

Embodiments overcome current technology barriers through a unique thermal and electrical engineering design which will allow for high throughput screening of materials and assembled prototype devices. Certain embodiments are the first high-temperature (e.g., operating at or above about 1000° C.) system capable consecutive measurement of both electrical and thermal conductivity without breaking vacuum or inert gas atmosphere, sample exchange, or change in instrument temperature. Embodiments allow for the establishment of both sub-component material quality during manufacturing, and qualification of energy conversion device efficiency straight off the production line.

Embodiments include an actively heated jacket (thermal guard) with three feedback controlled zones, which can allow for the elimination of parasitic heat loss channels that prevent prior art technologies from accurately determining the thermal conduction through a sample. Embodiments of an instrument are capable of measuring the intrinsic electrical properties (e.g., four-probe) and exact surface temperature of the material or device under investigation. FIG. 1 is a schematic of an embodiment of a bench-scale apparatus.

Converting waste heat to power has a technical potential of about 14.6 GW, with about 65% of the total potential in the petroleum refining, chemical manufacturing, and primary metals manufacturing sectors. Conversion of this energy to electrical power will have the largest market penetration in these sectors and is estimated to be on the order of S80B. Storage and conversion of electrochemical power, namely in the electric vehicle, military/aerospace, and portable electronics industries is estimated to have a market value of S11.9B by 2020 and is poised to create a revolutionary shift in the transportation sector within a generation.

In certain embodiments, for quantitative temperature-dependent electrochemical validation, the surface temperature of the material can be measured under operation at fast charging rates (e.g., about 350 kW to about 400 kW) where Joule heating is expected to contribute to up to about 90% of the volumetric heating rate, and ionic conductivity may influence the temperature asymmetry across the material.

There are three material properties that figure into the energy conversion efficiency of thermoelectric devices: (1) electrical conductivity, $\sigma$, (2) thermopower (Seebeck coefficient), S, and (3) thermal conductivity, $\kappa$. Currently, all three properties are measured in different instruments, at different times, and requiring different materials. Hence current instrumentation inherently lacks the ability to be integrated into the manufacturing line. The most common alternative scheme involves three separate measurements on three separate instruments: (i) electrical conductivity and thermopower are obtained by an Ulvac ZEM-3 instrument for a single rectangular bar of material, (ii) thermal diffusivity is measured using a Netzsch Laser Flash Apparatus (LFA) for a single cylindrical pellet, and (iii) specific heat capacity is measured using a Netzsch Differential Scanning Calorimetry (DSC) instrument for a single cylindrical pellet. An alternative method to measure thermopower involves thermocouples applied axially to minimize errors at high temperature, although this method lacks the capability to measure electrical or thermal properties.

There are several problematic complications in existing experimental methods. The electrical conductivity of cylindrical pellet samples can be measured using the van der Pauw method. This method, however, cannot be integrated with Seebeck or thermal conductivity measurements, as the voltage and current leads must be attached from the sides. During Seebeck and thermal conductivity measurements, this will introduce an additional parasitic heat loss that will distort the temperature gradient. This cannot be mitigated by attaching the leads to a radiation shield, since the electrical contacts will be touching a non-uniform range of temperatures. Thus, van der Pauw methods must be performed in a separate portion of the instrument or using an outside instrument altogether. A much simpler method involves running a current directly through a sample, using current leads embedded in the thermoelectric block. A square-wave alternating current is used to negate thermoelectric contributions to the measured voltage drop. Both heaters and the radiation shield are held at a desired temperature for measuring a desired property. The voltage fluctuation is then measured with a lead possessing a low Seebeck coefficient (niobium), and resistivity can be calculated. The major concern, however, is determining the effects that arise from non-uniform current distribution through the heat spreader and the electrical contact resistance. This is more concerning for instruments where thermocouples do not directly touch the sample.

Figure 3:
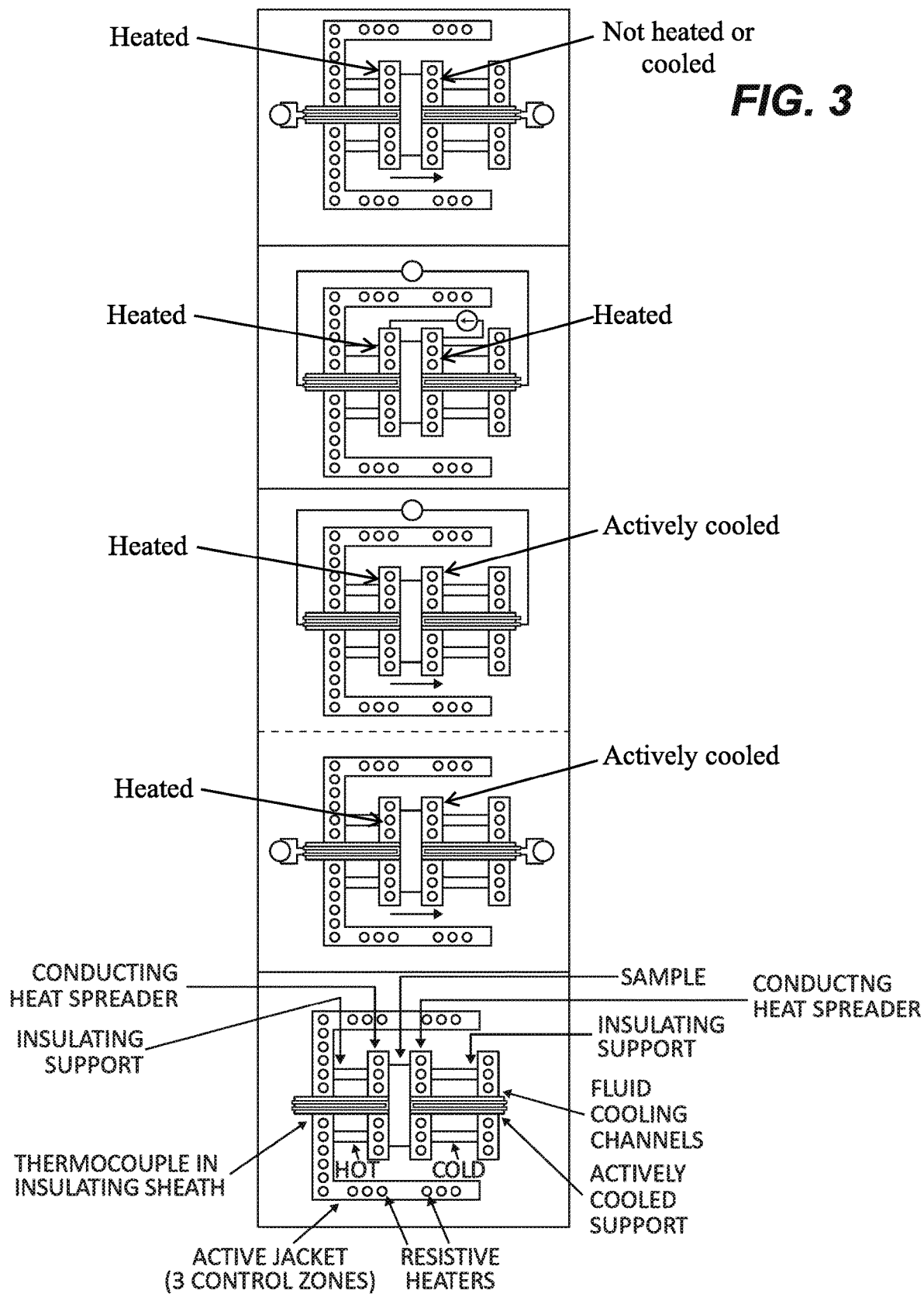
FIG. 3 shows an embodiment of this disclosure in various modes of operation.

FIG. 3 shows an overview of use of an embodiment of this disclosure in various modes which differs from current electrothermal property characterization methods. The properties that must be obtained to qualify energy conversion materials and devices during production are the electrical conductivity σ and the thermal conductivity κ. The Seebeck coefficient (S) can be used as a calibration method against NIST standards to quantify the temperature rise. Traditionally, there was no way to accurately measure κ, S, and σ on the same sample and at temperatures relevant to industrial processes and technical applications (>650° C.). At least some, if not all, embodiments of this disclosure can solve this problem through a unique thermal engineering design which can allow for high throughput screening of materials and assembled prototype devices. Additionally, the instrument can be scaled for integration with an advanced manufacturing production line, and capabilities extended for electrochemical device validation (e.g., four-probe ionic conductivity can be obtained in 'electrical conductivity' mode using electrical impedance spectroscopy (Nyquist plot analysis).

Certain embodiments include an instrument used to measure the electrical and thermal properties of materials from about room temperature to about 1000° C. and an instrument for measurement to about 2500° C., a capability that does not exist presently exist in the art. Four criteria for designing certain embodiments have been established, e.g., (i) heat spreader and sample size/alignment mismatch, (ii) sample radiation loss, (iii) parasitic thermal losses, and (iv) sample surface temperature variation.

The effects of each of these and the resulting errors have been examined through comprehensive multi-physics modeling. In certain embodiments, the size of the system can be limited in order to avoid any mismatch, a radiation shield operating at the hot-side temperature can be introduced (e.g., for practical reasons), an upper heater can be added in order to reduce parasitic losses, and a high in-plane conductivity interface material can be chosen to minimize the temperature variation.

Embodiments of the overall system have been found to have about −8.6 to about +8.2% error in thermal conductivity at about 1000° C., about −13.3% to −17.2% error at about 2500° C., and a about <2% error at about room temperature, and about −1.06% to about +1.76% error in electrical conductivity. The Seebeck coefficient error, which becomes important in qualifying the sample temperature measurement, was found to be −0.65% to +0.01% at 1000° C. and is negligible at room temperature. The geometrical errors appearing in both thermal and electrical conductivity contributed greatly to the errors. The Seebeck Coefficient errors also caused a large error increase due to its square term in the figure of merit equation. Since the temperature variation on the surface contributed to errors in both thermal conductivity and Seebeck coefficient, it also was a major contributor to error.

Embodiments can allow consecutive measurement of all electrical and thermal properties to include thermoelectric and battery device performance of a bulk material or assembled device without breaking vacuum or inert gas environment, sample exchange, or change in instrument temperature. This allows for the establishment of both material and device efficiency as well as the correlation of processing with properties. Currently there is no equipment which can do this.

Certain embodiments include an actively heated jacket (e.g., as a thermal guard) with three feedback controlled zones, which allows for the elimination of parasitic heat loss channels that prevent competing apparatuses from accurately determining the thermal conduction through a sample, for example.

Embodiments can allow property measurements (Seebeck, electrical conductivity, thermal conductivity, ionic conductivity) to be made consecutively while in vacuum or inert gas environment and on the same sample. Competing apparatuses require switching of the sample between different instruments, changing sample geometry, or requiring the use of different samples for each property measurement, which greatly reduces experimental confidence in the reported properties and is not beneficial for high throughput screening of materials.

Certain embodiments allow not only for both accurate property and efficiency measurements, but also for the correlation of property evolution with thermal processing history of the sample which is not possible in any other apparatus presently. Embodiments do not require a laser to transiently heat the sample. Embodiments can be scaled for integration with a roll-to-roll or other advanced industrial manufacturing line design.

Certain embodiments utilize metallic heat spreaders for applying current and measuring voltage and thermocouples for measuring voltage drop across a sample or device, which enables measurement of the intrinsic electrical and electrochemical performance of materials under investigation (e.g., including four-probe electrical conductivity, four-probe ionic conductivity). Thus, embodiments include a dual use of a heat spreader for providing both heat flow and electrical current flow.

Certain embodiments can be designed in order to avoid geometrical errors arising from alignment and size mismatch, and an actively heated radiation shield can be used to prevent error, and a top heater was added in order to reduce parasitic losses and prevent thermal shorting. The error in electrical conductivity persist to the measurement of ionic conductivity for electrochemical storage devices. The geometric errors appearing in both thermal and electrical conductivity contributed greatly to these errors, after accounting for non-planar polishing of samples. Since the temperature variation on the sample surface contributed to errors in both thermal conductivity and Seebeck coefficient, it also was found to be a major contributor to overall error. It should be noted that these errors are estimated as the upper limits for certain embodiments.

The material or product under investigation is denoted "sample." Axial thermocouples and heat spreaders can be spring-loaded to ensure contact pressure is maintained over a wide range of temperatures.

The sample can be placed between a metallic upper heat spreader and a metallic lower heat spreader. The lower heat spreader can be composed of a cylindrical base of about a 3.5 inch diameter and a co-axial cylindrical extrusion on top with a diameter of about 12.7 mm (e.g., to match the sample diameter used during phase I accuracy demonstrations). The base can have a height of about 3.5 inches, while the extrusion can have a height of about 1 inch.

Certain embodiments can include six about 1.25 inch-long cartridge heaters embedded into the base in a horizontal, radially symmetric configuration at about 2.5 inches above the bottom of the base. Any other suitable number and/or positioning of the cartridge heaters is contemplated herein.

Certain embodiments of these cartridge heaters can be functional up to about 1100° C. and can be capable of producing enough heat to establish a temperature gradient with room temperature at the bottom of the apparatus, where it is in contact with the vacuum chamber enclosure, and at least about 1000° C. at the top of the extrusion. This can be used to establish a negligible temperature drop at the top of the extrusion, preventing heat loss in this direction and driving all heating power dissipated in the upper heat spreader down through the sample under investigation. In addition to active control and minimization of the temperature difference between the upper heat spreader and the radiation shield, insulating support posts between the shield and the upper heat spreader can ensure power is dissipated through the sample. The temperature at the bottom of the base can be maintained using a liquid-cooled plate to establish a steady-state situation. The extrusion can both match the diameter of the sample and provide more space for the temperature gradient to become one-dimensional. An about 1/16-inch hole can be drilled axially through the center of the entire lower heat spreader, though which a thermocouple is inserted axially and spring loaded to press against the sample for improved thermal contact.

Certain embodiments of the upper heat spreader can be about 1.625 inches long, about 12.7-mm-diameter cylinder. Any suitable size is contemplated herein for the heat spreader and/or any other component of embodiments of this disclosure (e.g., embodiments can be scaled as desired). Certain embodiments include three about 1.25-inch-long cartridge heaters that can be inserted vertically from the top, and arranged symmetrically about the cylinder's axis, for example. While these may have a much lower heat output than the cartridge heaters in the lower heat spreader, these can be used to establish the temperature gradient across the sample. The heat output of these three cartridge heaters are also used to determine the total power (Q) delivered to the sample which is needed for the calculation of thermal conductivity, $\kappa_{sample} = [Q/(T_{hot} - T_{cold})]*(\text{Length/Area})$.

An about 1/16-inch hole can be drilled axially through the center of the heat spreaders, through which a thermocouple can be inserted and spring loaded to press against the sample for maintained thermal contact over a wide temperature range. The three posts can also spring loaded to push down on the upper heat spreader to ensure good thermal and electrical contact between the heat spreaders and the sample.

Films of any suitable thermally conductive material (e.g., Grafoil®) can be placed in between the two heat spreaders and the sample in order to further ensure good thermal contact. The graphene film sheets can also act as a chemical barrier to prevent reactions between the metallic heat spreaders and the sample when non-graphitic samples and devices are under investigation, for example.

The tops of the three posts and the upper thermocouple can be sunk into the top heater. This heater can be composed of an about 4-inch-diameter cylindrical metal disk suspended over rest of the setup using insulating posts. It can be about 1-inch-thick, and/or can have eight (or any other suitable number) about 1.25-inch-long cartridge heaters embedded horizontally and symmetrically about the center axis. These can be placed about 0.75 inches away radially from the center. Any suitable number and/or sizes/shapes for these and any other components of embodiments of a device are contemplated herein.

This top heater can be set to be equal to the upper heater temperature in order to prevent parasitic losses from the upper heater. In addition, an about 0.1 inch thick, about 1 inch diameter cylindrical sheet of polished metal can drop down to cover the upper heat spreader, the sample, and the extrusion portion of the lower heat spreader. This can serve as a radiation shield to reduce any radiation losses from the sample or the upper heat spreader.

The axially-inserted sample thermocouples can be seen in FIG. 4. FIG. 4 shows a tip of the axially-inserted thermocouple and its cross geometry. The tubing can be about 1/16 inch diameter alumina, for example. It can include a four-bore, about 1/16-inch diameter insulating cylinder (or any other suitable number of bores and/or shapes). Any combination of thermocouple wires, for example a tungsten wire and a niobium wire, can be threaded through the bores in a cross geometry. This thermocouple setup allows for the wires to be directly pressed against the sample without any of the displacement caused by the more commercially available bead design. The niobium wire can be on top of the tungsten wire, as the niobium is the less chemically reactive of the two. The niobium wire may be chosen due to its low Seebeck coefficient as well as chemical inertness. However, it is contemplated that any suitable material(s) may be used for the thermocouple, not just niobium and tungsten wire.

The thermocouple pair can be calibrated through both isothermal measurements without a sample present, and determination of a correction factor via Seebeck measurements on NIST reference samples as will be discussed, where the niobium leads can be used to measure the voltage drop across the sample. In addition, electrical leads can be attached to the base of the lower heat spreader and the top portion of the upper heat spreader. These wires can be used to drive an alternating current through the sample for the measurement of its electrical conductivity. The voltage response for the electrical measurement can be obtained using the niobium voltage leads, for example. An alternating current can be used to factor out any Peltier effects caused by the current, as known to those having ordinary skill in the art.

Figure 5:
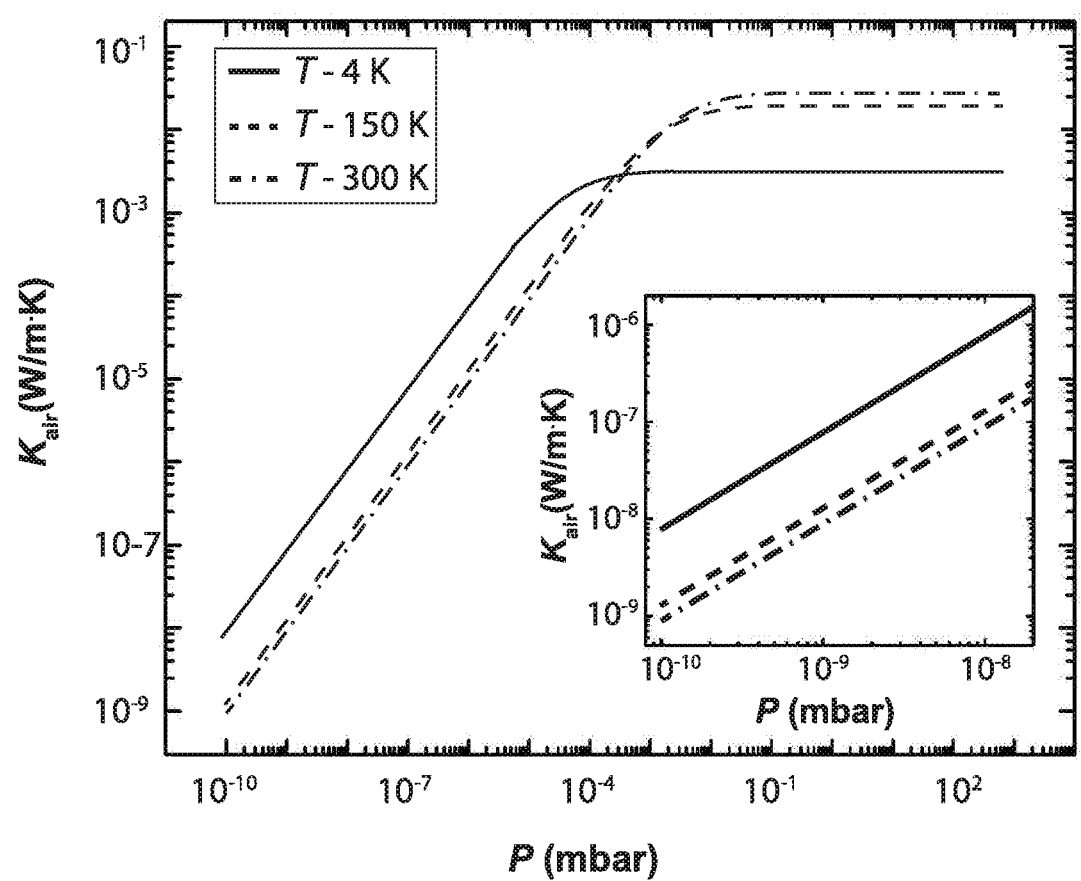
FIG. 5 shows a kinetic theory calculation of the thermal conductivity of residual air molecules, air, inside an enclosed chamber as a function of temperature.

Standard K-type thermocouples can be used to monitor the temperatures of the two heat spreaders and the top heater. The thermocouple and the electrical wire for the lower heat spreader can be attached to the heat spreader down to the liquid-cooled plate in order to prevent any additional parasitic losses. The upper heat spreader thermocouple and electrical wire, as well as the top heater thermocouple, can be attached to the top heater itself before exiting the system in order to prevent any parasitic losses from the upper heat spreader. The entire system can be placed within a vacuum chamber at about $<10^{-6}$ mbar to prevent any convective or gas conduction parasitic heat losses (see, e.g., FIG. 5). FIG. 5 shows kinetic theory calculation of the thermal conductivity of residual air molecules, air, inside an enclosed chamber as a function of temperature. High vacuum is usually required for thermal conductivity measurements to prevent a parasitic air conduction channel.

For the selection of materials, highly polished, oxygen free copper, tungsten, and molybdenum can be chosen for the heat spreaders for their high thermal and electrical conductivity. Any other suitable material(s) are contemplated herein. While materials like boron nitride also have high thermal conductivity, their high electrical resistance may make them undesirable for this purpose. In addition, being highly polished can reduce their emissivity and thus the error caused by radiative heat transfer.

For the thermocouple tubing and other insulating components, aluminum oxide can be used due to its low thermal and electrical conductivities, as well as its sufficient strength under compression for spring-loading. Any other suitable material(s) are contemplated herein.

As described above, four parameters can be used to guide system design. These are the sample-heat spreader mismatch, the radiative losses, the parasitic heat losses, and the sample surface temperature distribution. All four of these errors can significantly affect thermal conductivity uncertainty, while the sample surface temperature distribution also affected the Seebeck coefficient measurement.

Figure 6:
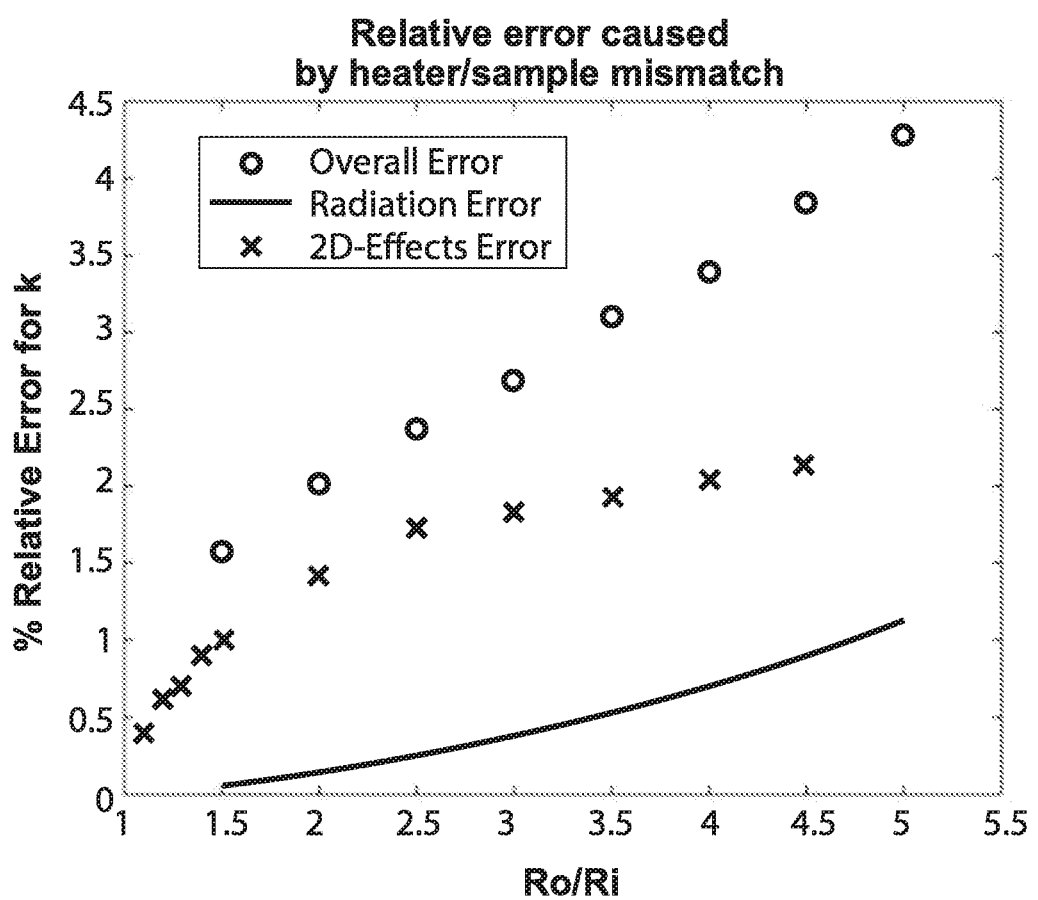
FIG. 6 shows uncertainty in thermal conductivity due to errors in heat spreader and sample geometry mismatch.
Figure 7:
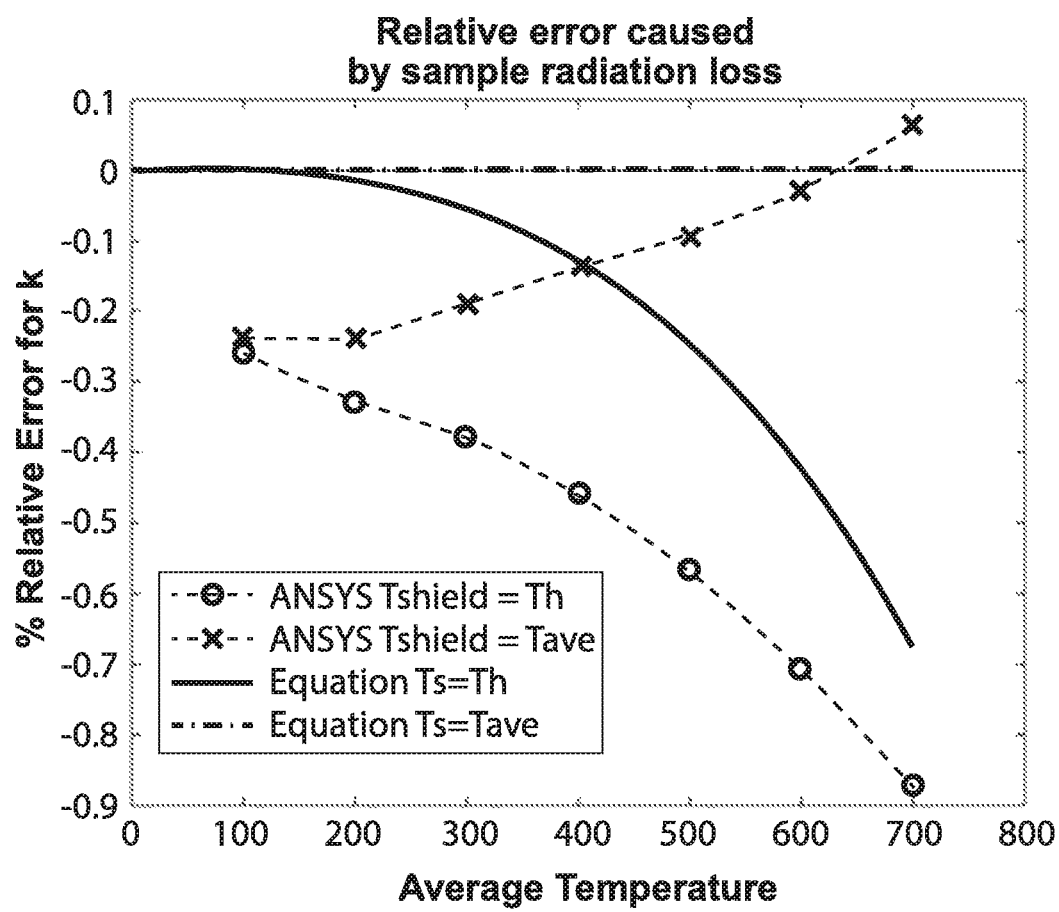
FIG. 7 shows uncertainty in thermal conductivity due to errors in radiation loss to the apparatus thermal guard as a function of temperature (° C.) for two thermal guard temperature set point values.

The first source of error was caused by the mismatch between the heat spreader diameter and the sample diameter. For a fixed sample diameter of 12.7 mm, attempting to increase the diameter of the heat spreaders (e.g. to accommodate larger-diameter cartridge heaters) will cause a mismatch between the heat spreaders and the sample. This will cause some shunting in the heat transfer, where a portion of the heat flows between upper and lower heat spreaders through radiation rather than conduction alone. The uncertainty introduced by such shunting, $U_{mismatch}$, can be estimated using the equation $$U_{mismatch} = \frac{\varepsilon\sigma(T_{cold}^2 + T_{hot}^2)(T_{cold} + T_{hot})L_{sample}}{\kappa_{sample}}\left(\frac{r_o^2}{r_i^2} - 1\right), \quad (1)$$

where $\varepsilon$ is the heat spreader emissivity, $\sigma$ is the Stefan-Boltzmann constant, $T_{hot}$ and $T_{cold}$ are the upper and lower heat spreader temperatures, $\kappa_{sample}$ and $L_{sample}$ are the sample thermal conductivity and length respectively, and $r_o$ and $r_i$ are the heat spreader radius and the sample radius respectively. The temperatures at the thermocouple locations were used to back calculate the thermal conductivity of the sample, which were then compared to the actual sample conductivity to produce an estimate of uncertainty. This was repeated for multiple mismatch ratios $r_o/r_i$ and plotted in FIG. 6. FIG. 6 shows uncertainty in thermal conductivity due to errors in heat spreader and sample geometry mismatch using Equation 1.

The process was also repeated with a two-dimensional (2D) simulation excluding radiation to observe the pure 2D conduction effects. As can be seen, the error caused by the geometrical mismatch is much greater than the error caused only by the radiative shunting by at least 1.5 to 3.5%. The 2D effects have a significant contribution to the error, especially at the lower mismatch ratios, due to the non-uniform temperature sample surface that it creates. The 2D effects, however, grow slower as the mismatch ratio increases.

Finally, the error caused by mismatch is significantly large, with ~1.5% at a ratio of 1.5 and reaching ~4.3% at a ratio of 5. Therefore, the mismatch error cannot be ignored. Although it is possible to have only one heat spreader match the sample and still avoid radiative shunting, this will not remove the extrusion on the lower heat spreader with the matching diameter is necessary to completely remove the mismatch error. It is worth noting, however, that the mismatch error decreases rapidly from 1.5% at a ratio of $r_o/r_i=1.5$ as its limit must reduce to 0% at a ratio of unity. This means that any mismatch error caused by the minute variations in the sample diameter an alignment will be negligible. Additionally, having the radiation shield radius nearly matching heat spreader can be helpful due to reflections involved.

There were two major sources of error caused by radiative losses in the system. The first source of error was caused by the radiation losses or gains directly from the sample. A simulation was run using a radiation shield set at $T_{hot}$ and another at $T_{avg}=\frac{1}{2}(T_{hot}+T_{cold})$. The sample conductivity was back calculated and then compared to actual conductivity in order to produce an uncertainty estimate. The resulting errors can be seen in FIG. 7, which shows uncertainty in thermal conductivity due to errors in radiation loss to the apparatus thermal guard as a function of temperature (° C.) for two $T_{shield}$ values. As can be observed, the magnitude of the errors stays within 1% for both radiation shield temperatures. It is worth noting that the $T_{shield}=T_{hot}$ tends to underestimate the thermal conductivity, while $T_{shield}=T_{avg}$ shifts from underestimating to overestimating as the temperature increases. In addition, the overall error magnitudes for setting the shield temperature as the average temperature tends to be smaller, remaining below 0.25%. Therefore, strictly from the sample radiation errors, $T_{shield}=T_{avg}$ is preferable, but requires an extra set of feedback controlled heat sources in the thermal guard. The error can also be estimated using the following expression to calculate the radiative losses $$q_{rad}=2\pi rL\varepsilon\sigma[(T_{hot}^4+T_{hot}^3T_{cold}+T_{hot}^2T_{cold}^2+T_{hot}T_{cold}^3+T_{cold}^4)/5-T_{shield}^4], \quad (2)$$

where L is the total height of the heat spreaders and sample. This allows us to estimate the radiative losses and calculate the resulting errors. The error predicted by this equation can be seen also plotted in FIG. 7. For the situation where the shield temperature is the hot side temperature, it appears that the errors for the actual simulation is shifted down by a margin of ~0.25%.

The second major source of error is caused by radiation losses from the upper heat spreader itself. An overestimating error calculation was done by assuming a constant heat input from top of the heat spreader and a linear temperature gradient along the axis. Equation 2 can then be used by replacing the sample geometries and thermal boundary conditions with those of the upper heat spreader. Using the same parameters as the ANSYS simulation at $T_{avg}=600°$ C., this resulted in an error of 0.23% for $T_{shield}=T_{hot}$ and 0.66% for $T_{shield}=T_{avg}$. The maximum error from combining the sample losses and the upper heat spreader losses are then 0.74% and 0.71% respectively at 600° C. The errors caused by the two radiation shields are similar. By using $T_{shield}=T_{hot}$, however, it is possible to remove one temperature controller from the system, which will allow for a faster thermal settling time and lower the instrument costs. Since neither error is prohibitively dominant, $T_{shield}=T_{hot}$ was chosen for practicality purposes.

In order to measure the temperatures on the sample, it is necessary to insert thermocouples at the surface. These thermocouples, however, will also cause parasitic heat losses. Not only will this cause an overestimation of the heat flowing through the sample, but it will also cause a distortion in the temperature gradient on the sample surface where contact is made. This effect was observed using an ANSYS simulation, with errors caused by both the heat loss and the temperature variation when the thermocouple is not near the sample temperature. The heat loss causes prohibitively large errors until the top heater tip temperature is brought close to the sample hot side temperature. For $T_{hot}$=600° C. this error reduces to ~1.8% for a thermocouple temperature of 600° C. Some error still remains, due to the fact that the upper portions of the upper heat spreader actually gets hotter than the sample hot side temperature.

In addition to the temperature variation caused by the parasitic losses, there is a significant drop in temperature at the about 1/16-inch hole where the thermocouples are inserted due to there being no direct contact with the heat spreader. This results in a temperature variation of up to 1.1° C. when the temperature drop used is about 10° C. This can be mitigated by using high thermal conductivity Grafoil® thermally conductive films (or any other suitable material) to help spread the heat to the center of the sample where the thermocouple probe is positioned.

Figure 8:
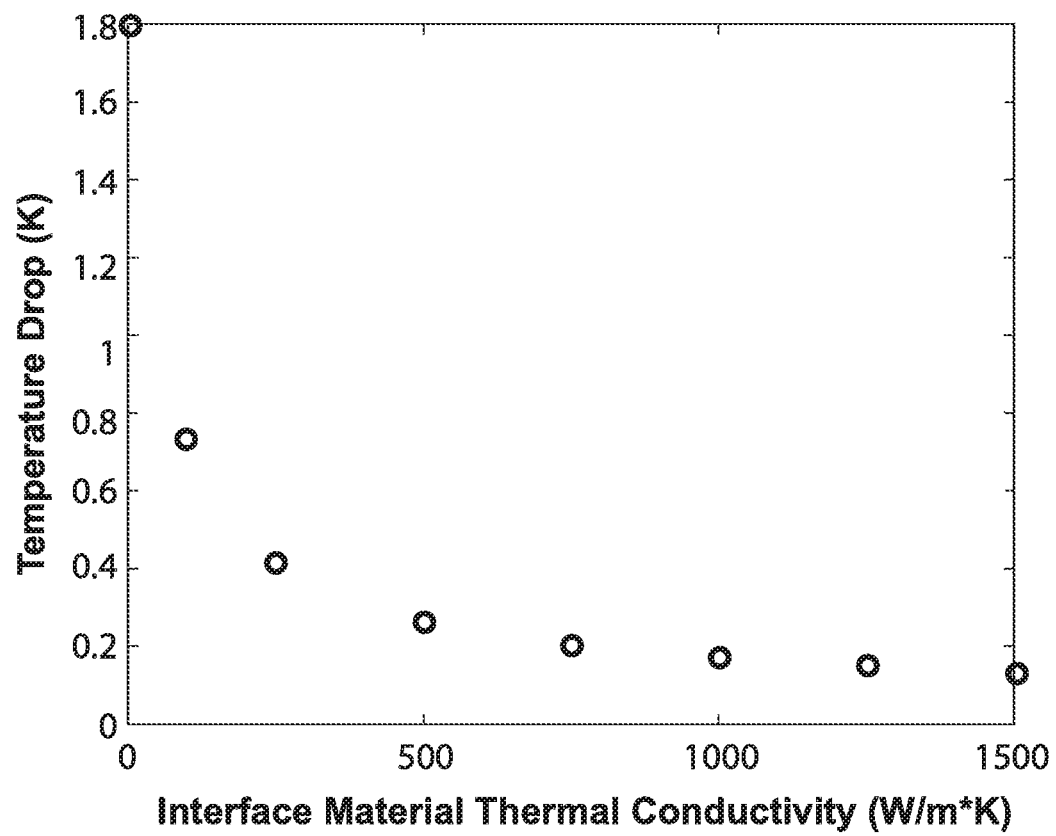
FIG. 8 shows maximum temperature variation on the sample surface for different interface material in-plane thermal conductivities.
Figure 9A:
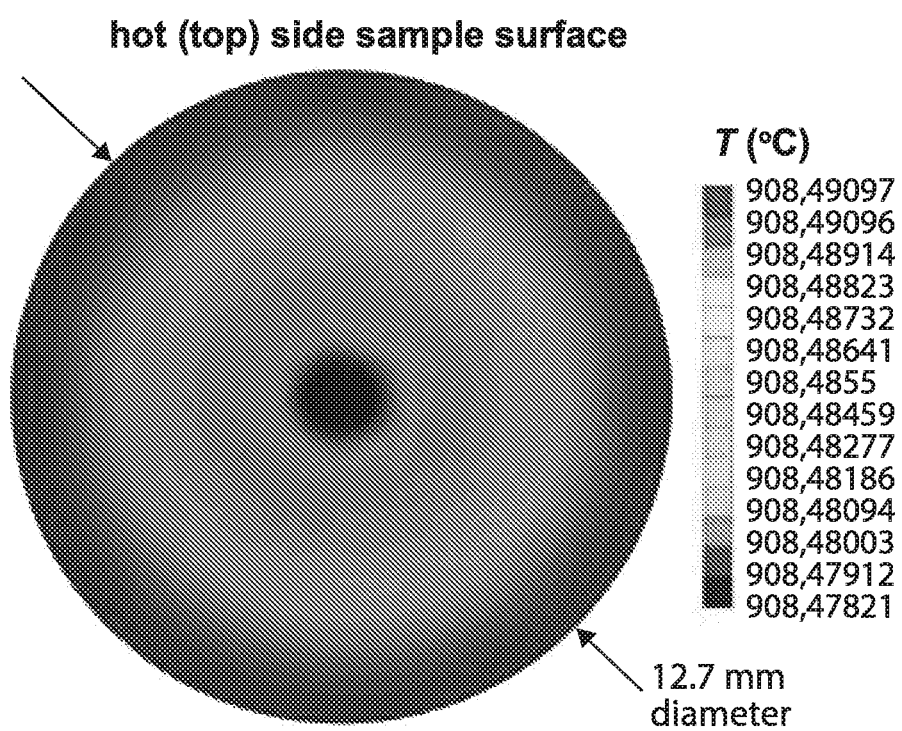
FIGS. 9A-9D and 10A-10D show temperature distributions across the sample diameter at the top and bottom surfaces as a variation from the sample center temperature at nominal operating temperatures of 900° C. and 2500° C. respectively.
Figure 9B:
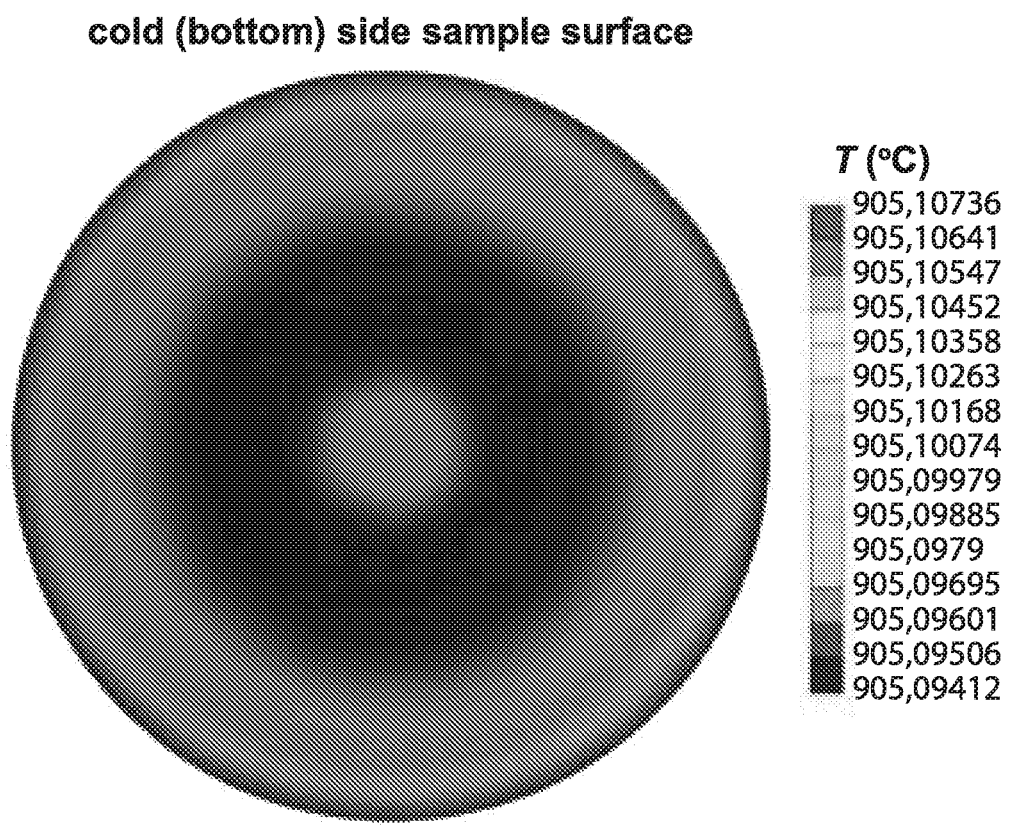
Figure 9C:
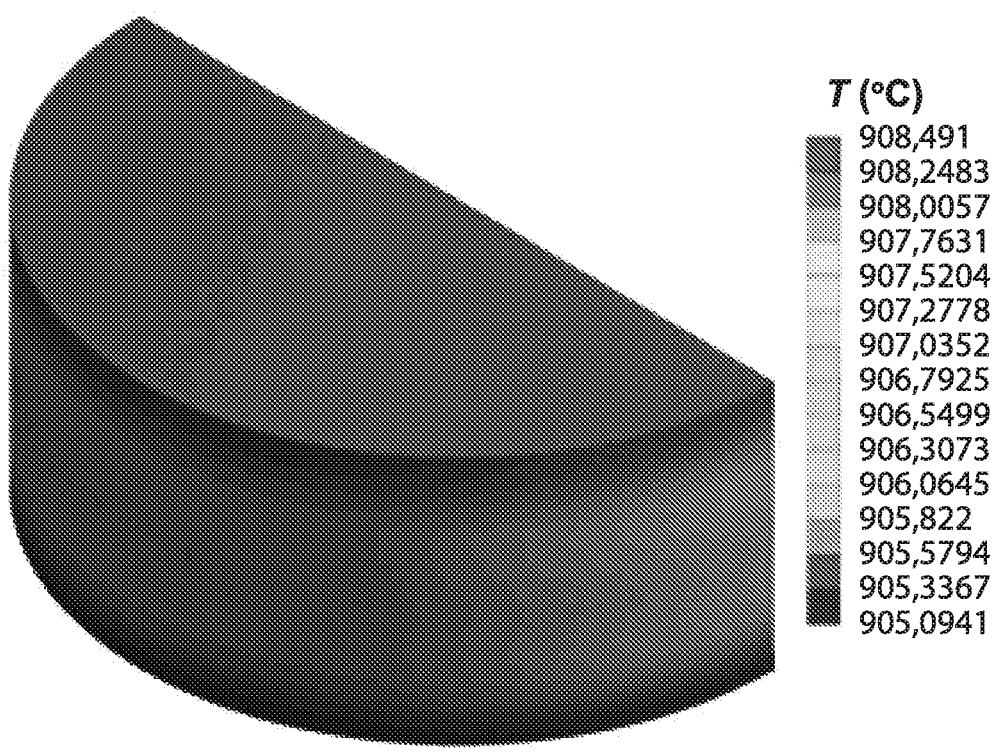
Figure 9D:
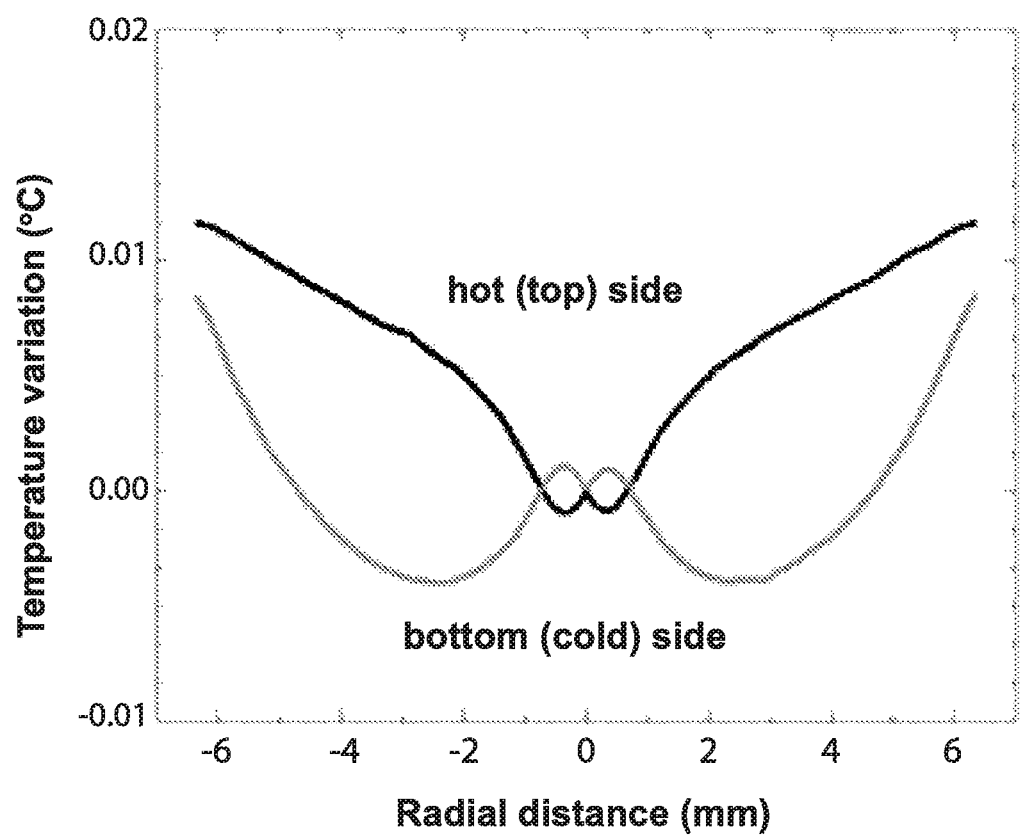
Figure 10A:
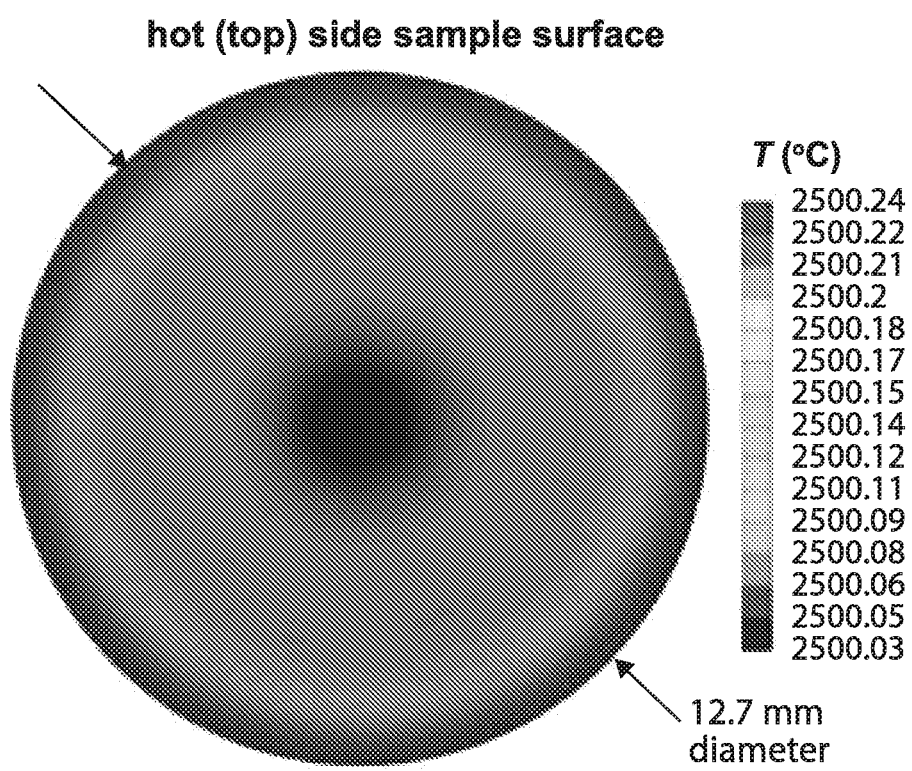
Figure 10B:
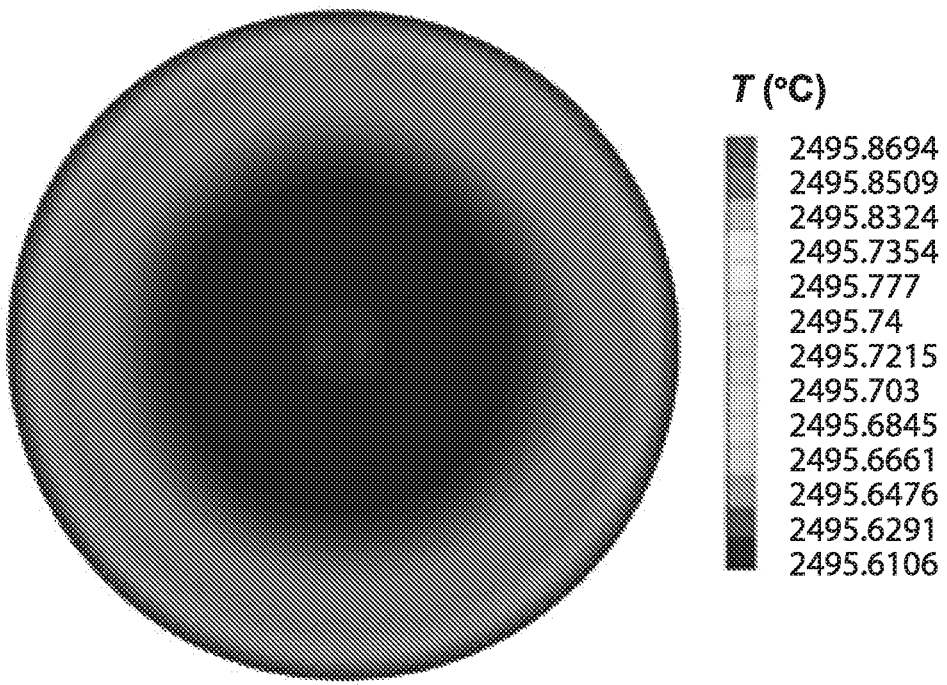
Figure 10C:
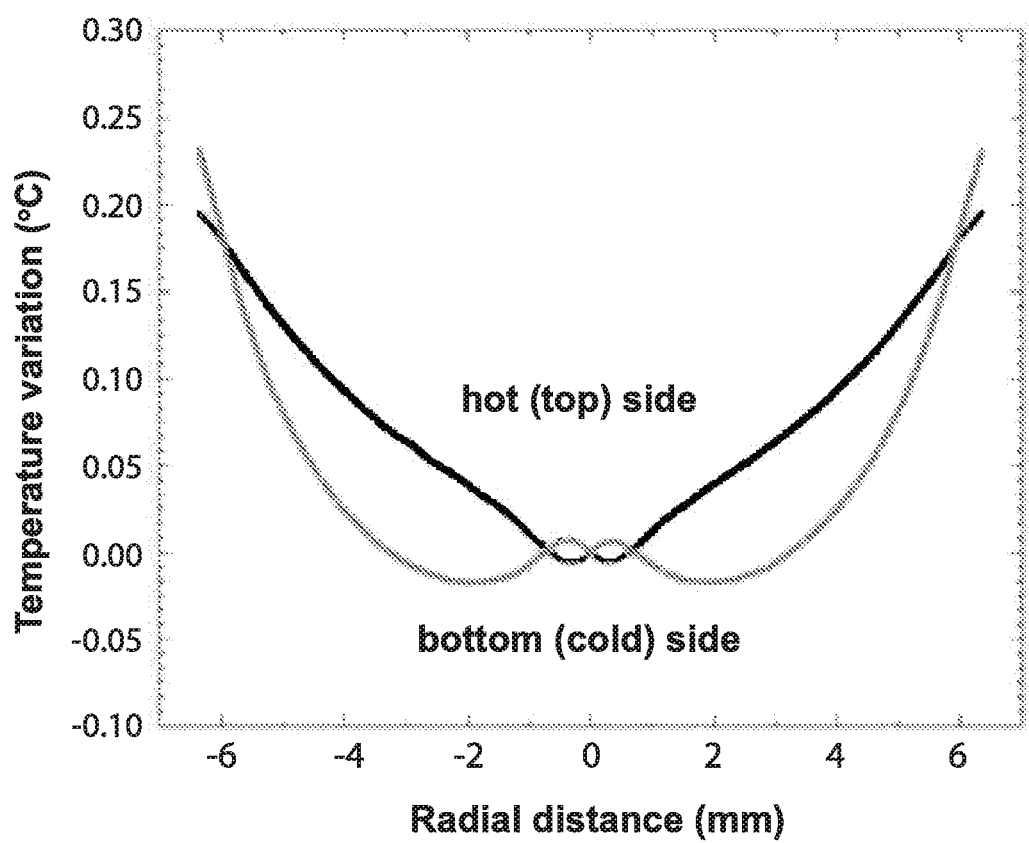
Figure 10D:
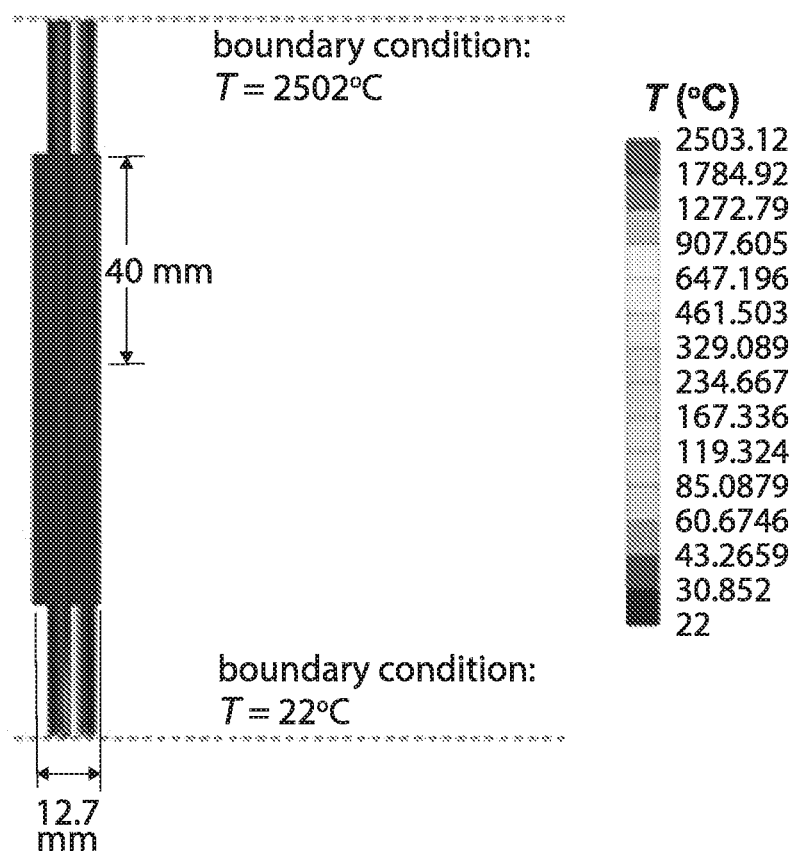

An ANSYS simulation used to investigate this error for varying thermal conductivities of the thermal interface material. The resulting temperature variations are plotted in FIG. 8. FIG. 8 shows maximum temperature variation on the sample surface for different interface material in-plane thermal conductivities. The temperature variation initially dropped quickly but became more constant as the conductivity passed 750 Wm$^{-1}$K$^{-1}$. At 1500 Wm$^{-1}$K$^{-1}$ (the in-plane thermal conductivity of the Grafoil® film selected), the temperature variation is as low as 0.2° C. for a sample surface at $T_{hot}$=700° C.

By accurately tracking the amount of heat flowing down the sample, our innovation can be used to measure thermal conductivity using the equation, $\kappa_{sample}=[Q/(T_{hot}-T_{cold})]\cdot$(Length/Area). Due to the large heat losses in competing technologies (Snyder and ZEM-3 instruments shown in FIG. 2), the power input to the heaters will vary wildly from the actual heat flow through the sample, and therefore be unsuitable for thermal conductivity measurements. This is particularly relevant at higher temperatures, where the heat losses are magnified by the fourth-power term present in radiative losses.

Embodiments overcome the limitations of previous technologies by carefully designing for uncertainty of terms that enter the thermal conductivity expression. The error sources for thermal conductivity are listed in Table 1.

TABLE 1

Error sources estimated for the direct measurement of thermal conductivity using our invention.

| Temperature (° C.) | 100 | 300 | 600 | 800 | 1000 |
| --- | --- | --- | --- | --- | --- |
| Temperature error (%) | 0.21 | 0.26 | 0.30 | 0.41 | 0.65 |
| Heat flux error (%) | 2.09 | 1.66 | 2.03 | 4.31 | 7.64 |
| Propagated thermal conductivity error (%) | 2.10 | 1.68 | 2.05 | 4.34 | 7.66 |
| Direct thermal conductivity error (%) | 2.17 | 2.03 | 2.19 | 4.60 | 8.22 |

Since the sample diameter can be pre-set by a press to be 0.5 inches, its error in diameter can be assumed to be small as 0.1 mm. The sample height, however, is determined by the user and can be changed as necessary. Its error is determined by the precision of the caliper used to measure the height, approximately 0.1 mm. In addition, if the sample surface is sloped, there will be some variation on the sample height. At a 2° tilt, there will be a variation of 0.44 mm in height by simple trigonometry. Since the thermocouples are inserted axially, there is no additional height errors or location averaging that occurs from the use of horizontally-inserted probes (as is the case with the ZEM-3 design). The cartridge heater errors are estimated from the voltage and current readings of the controller used. The combined errors were calculated using standard error propagation methods. The largest errors came from the variation of temperature on the sample surface as well as the sample geometry itself, both of which are difficult to reduce further with the instrument.

Measured thermovoltage and Seebeck coefficient of a reference sample can be used to determine a calibration coefficient linking the thermocouple probe temperatures to the intrinsic temperature at the top of the sample. The error for the Seebeck coefficient is dependent on the calibration curve created for the custom thermocouple. Thus, it relates to the uncertainty in temperature when a sample with a known Seebeck coefficient is used as a calibration standard. Additional factors entering the uncertainty are the temperature variation of 0.2 K and the resolution error of 0.1 K. The voltage meter's resolution and error was also taken into account. Therefore, the overall Seebeck coefficient error for a temperature drop of 10 K across the sample will be approximately 1%.

The error sources for the electrical conductivity are listed in Table 2. It is affected by the same geometric factors as thermal conductivity.

TABLE 2

Error estimated for the direct electrical and thermal properties using our apparatus at about 1000° C. Errors in ionic conductivity will be that we report for electrical conductivity.

| Measured property | Uncertainty |
| --- | --- |
| Thermal conductivity | −8.6% to +8.2% |
| Electrical conductivity | −1.06% to +1.76% |
| Seebeck coefficient | −0.65% to +0.01% |
| Figure of merit | −8.37% to +8.78% |

Assuming a worst-case scenario of low pressure contact, the electrical contact resistance will be approximately 0.00111 Ω for one side of the sample, although it will vary depending on the sample. In addition, there is the error in the actual current applied to the system, estimated at 0.1% of the output. The resistances of the heat spreaders and the connecting wires can be calibrated as necessary. For 5-mm-tall sample with an input current of 100 μA, and a voltage drop of 40 μV, the overall error will be on the order of 2%. This error incorporates the error due to current leakage through the voltage probes, which operate at open circuit condition with an input impedance of $10^{10}$ Ohm. The largest contributor to this error will mainly be the contact resistance losses. This error can be mitigated in relation to the total electrical resistance by increasing the height of the sample. Although this will increase the radiative losses, that is not a concern due to the low error caused by such losses. The combined errors for all relevant thermophysical properties in our apparatus is given in Table 2.

The ionic conductivity of a sample or product can be measured by either AC or DC impedance spectroscopy. In this method, a sinusoidal potential is applied to the electrolyte at different frequencies. The sample response can be analyzed by a circuit of resistors, capacitors, Warburg, and constant-phase elements. This equivalent circuit considers the response of three RC-circuits for the bulk and grain boundary conductances, and diffusion due to concentration gradients in the electrode. By this analysis the contribution of each component can be extracted from the total conduction of the electrolyte. Electrical conductivity can be measured using either an AC or DC measurement via either a two-probe or a four-probe method, and the temperature measured using the thermocouples in direct contact with the sample surfaces. For an ideal electrolyte, the ratio of the electrical conductivity to the ionic conductivity should be as close to zero as possible.

In order to accurately measure in ionic and DC conductivity of the samples, we have designed our apparatus to be capable of measurements in the practical battery temperature range from about −40 to about 120° C. with minimum and maximum temperatures of about −196 to about 1000° C. Two Peltier modules can be placed at the top and bottom for cooling/heating of the samples near room temperature, and the previously described resistance heater cartridges and actively cooled heat sink using liquid nitrogen or aqueous coolant will be used to cover the low and high temperature limits. The signals will be processed by a potentiostat. The samples or products are loaded against the top and bottom electrodes with Li foils on the both sides in a configuration of Li/electrolyte/Li. The electrodes are made of type-T thermocouples (or any other suitable thermocouple) which are spring loaded against the samples to ensure a firm contact at different temperatures.

The thermal conductivity measurements can be conducted using embodiments described previously, for example. This allows for direct thermal characterization of electrochemical materials operation under industrially-relevant cycling conditions for the first time.

Thermoelectric devices are capable of directly converting between electrical and thermal energy by making use of the Seebeck effect. This can then be used for applications ranging from recovering waste heat of automotive engines to providing alternative method of harvesting solar power. The current conversion efficiencies, however, are too low for practical applications. Therefore, method of increasing this conversion efficiency are currently a topic of research, and measurement instruments have been devised to characterize the results. The efficiency is often measured by the dimensionless figure of merit zT, which is in turn determined by the thermal conductivity, the electrical conductivity and the Seebeck coefficient.

The problem arises, however, if an instrument is inaccurate or has an excessive measurement error. Certain studies of the Seebeck coefficient measurements for undoped $Bi_2Te_3$ and constantan found coefficients of variations of approximately 0.04 and 0.06 at 100° C., respectively. Certain studies of the Seebeck coefficient and electrical resistivity of $Bi_2Te_3$ and $Bi_{.5}Sb_{1.5}Te_3$ revealed measurement errors of about ±5.5% for Seebeck coefficient and ±12.5% for the electrical resistivity on the first round of measurements, and ±4% for Seebeck coefficient and ±5% to ±9% for the electrical resistivity on the second round. This indicates the level of uncertainty present in the currently used instruments. If an instruments results vary too widely from these margins, or has an excessive measurement error, then its results may lose some significance. While the individual errors may remain within an acceptable range, when converted into the zT form the propagated error can become excessive. Indeed, certain studies for all thermoelectric properties revealed a variation in zT ranging from ±11.5% to ±16.4% from temperature ranges of 20 to 500° C. due to the large error in its component properties. The problem is further exacerbated when different measurement instruments are used for each of the component properties, as this not only combines the errors in each of the instruments, but may also require different sample preparations, degradation of the samples, or use of multiple samples in general.

As for existing measurement instruments for thermoelectric properties, one type of instrument called ZEM-3 measures the Seebeck coefficient and the electrical conductivity by either setting a temperature gradient across the top and bottom contacts of a rectangular sample, or pulsing an electrical current through, respectively. It then measures the voltage response using two thermocouples/voltage probes along the sample sides to extract the properties. By measuring at the sample sides in a four-probe off-axis geometry, this avoids the additional contact resistances present in two-point geometries in which the probes are embedded in the contacts. Certain studies show, however, that this results in an error of up to −13.1% at high temperature ranges of ~900° C. for the Seebeck coefficient. A major contributor to this error is the cold-finger effect, in which the probes at sample sides leech heat away from the sample and thus distorts the temperature gradient. As a solution for this effect, an instrument in which the probes are inserted axially through the contacts and onto the sample can be used, thereby avoiding both the contact resistance and the cold finger effect. Traditional instruments, however, is designed only for measurement of the Seebeck coefficient and ignores the other two thermoelectric properties.

This experimental analysis is used to confirm whether there is a reduction of the error caused by the cold finger effects in such an instrument, using finite-element analysis in the first half of Section II. In addition, a set of modifications will be proposed in order to use the same instrument for the measurement of thermal and electrical conductivity. In Section III, the design's thermal conductivity measurement errors will be examined with attention paid to potential sources of heat loss (e.g. radiation or parasitic), while Section IV will examine the electrical conductivity measurement errors with concerns towards creating a uniform current through the contacts.

In order to analyze the uniaxial four-point geometry and its cold finger effects, a finite element model of the instrument was produced using Iwanaga et. al's designs. A 25 mm diameter, 5 mm thick pellet sample was used. Two boron nitride heat spreaders were placed at the top and the bottom of the sample, with diameters of 80 mm and height of 80 mm each, with a 0.25 mm thick sheet of Grafoil® in between matching the sample diameter. Cylinders with 12.7 mm diameter and 50.8 mm height were used in place of cartridge heaters, with six heaters embedded into each of the heat spreaders symmetric about the center axis. Two 1.5875 mm diameter mullite tube were inserted through the center of the heat spreaders and onto the surfaces of the Grafoil® sheets at the top and the bottom. Two 0.1 mm thick leads of chromel and niobium were then threaded through the mullite tubing and embedded into the Grafoil® sheets. Three thin-walled cylinders of Inconel with 12.7 mm diameter and 0.71 mm thickness were each placed axis-symmetrically on the top and the bottom heat spreaders. Copper wires of 1.6 mm diameter were attached to the outer surface of each of the cartridge heaters, while a 1.6 mm diameter thermocouple probe was embedded into each of the heat spreaders. All of the wires, probes, mullite tubing, niobium and chromel leads, and Inconel cylinders were made to terminate 174 mm from the top and the bottom edges of the heat spreaders. The entire model was setup with a bilateral symmetry, and the system was bisected vertically to reduce the computational cost.

A thermal boundary condition was set up so that those terminating ends were at room temperature. All outer surfaces were assumed to be perfectly enclosed in a radiation shield set at temperatures of 300° C., 500° C., 700° C., and 900° C. The sample sides were also set to undergo radiation with the overhanging surfaces of the heat spreaders. The lower cartridge heaters were set with internal heat generation values to create temperatures of 300° C., 500° C., 700° C., and 900° C. at the center of the bottom sample surface. The cartridge heaters in the top heat spreader were set as internal heat generation with values adjusted to produce a temperature gradient of approximately 5° C. across the sample. The exposed surfaces from the bisection were set with an adiabatic boundary condition due to symmetry. It was assumed that the entire system was placed in a vacuum condition with no convective heat transfer, and that contact resistances are negligible. It was assumed to be in an open-circuit condition in order to neglect thermoelectric effects in the wires during modeling. Thermal conductivities and emissivity for the boron nitride, mullite, niobium, and chromel were estimated using the Thermophysical Properties of Matter handbooks. The sample was assumed to be silicon dioxide, with the same handbooks used for property values. The thermal conductivities of the Grafoil® and Inconel were estimated using product specifications from Graftech Inc. and the Special Metals Corporation, respectively. Sample emissivity was approximated at 0.7, while the temperature controller probe conductivity and emissivity were set at 30 W/(m-K) and 0.1, respectively. The entire model was discretized into 1,340,789 elements, and the Mechanical APDL non-linear iterative solver was used.

The temperature distribution across the sample diameter at the top (e.g., shown in 9A) and bottom surfaces (e.g., shown in 9B) can be seen in FIGS. 9A-9D as a variation from the sample center temperature. It can be seen that while the sample temperature is a minimum at the center for the top surface, it is the maximum for the lower surface. This indicates that the cold-finger effect is no longer the dominant effect for the sample surface temperature distribution, as that would have resulted in a minimum for both. Instead the distribution is primarily distorted by the fact that the thermal resistance is much higher at the sample center, due to the presence of the hole through which the thermocouple is inserted. Since the surrounding heat spreaders have much lower resistance, more heat flows through the sides, causing higher temperatures on the hot side and lower temperatures on the cold side. While the Grafoil® sheet reduces this effect and creates a more uniform temperature distribution, a significant amount of variation remains. In addition, the plot for the lower surface shows that, even as the measurement temperature varies, the variation itself remains fairly constant. While the upper surface temperature distribution changes with the measurement temperature, this can be attributed to the radiation at the sample sides, causing an increasing cooling effect.

The error in the temperature drop was defined as $$U_{\Delta T} = \frac{(T_{hot,max} - T_{cold,min}) - (T_{hot,measured} - T_{cold,measured})}{(T_{hot,measured} - T_{cold,measured})}, \quad (a)$$

in which the measured temperature was defined at the center where the thermocouple was placed. This resulted in error listed in Table A. In addition, the analysis was repeated but with a ΔT=10° C. for T=500, 700, and 900° C. In this latter case, the overall temperature variation remained fairly constant, and therefore the relative error itself decreased. While the errors at ΔT=5° C. are not prohibitive by itself, its effect will be magnified as it propagates to the Seebeck coefficient and then the figure of merit, due to the square term involved.

Therefore in order to maintain a reasonable level of error, keeping a sizable ΔT>5° C. during measurement is recommended.

TABLE A

| Relative error due to temperature variation uncertainty, $U_{\Delta T}$ | | | | |
|---|---|---|---|---|
| Nominal temperature (° C.) | 300 | 500 | 700 | 900 |
| $U_{\Delta T}$, (%) with ΔT = 5° C. across sample | 7.12 | 7.00 | 6.61 | 5.68 |
| $U_{\Delta T}$, (%) with ΔT = 10° C. across sample | — | 3.06 | 2.71 | 2.24 |

By keeping track of the amount of heat flowing down the sample, the same setup can also be used to measure thermal conductivity using the equation $$\kappa = -\frac{q_{sample} L_{sample}}{\Delta T A_{cross-sectional}} \quad (b)$$

Due to the large heat losses in the instrument itself, the power input to the heaters will vary wildly from the actual heat flow through the sample, and therefore be unsuitable for thermal conductivity measurements. This is particularly relevant at higher temperatures, where the heat losses are magnified by the fourth-power term present in radiative losses.

It is, however, possible to minimize the heat losses from one side of the instrument in order to estimate the amount of sample heat flux using the power supplied to the cartridge heaters. In order to minimize the conductive losses through the supporting columns and probes, using long and narrow geometry with low thermal conductivity materials is not enough, as the residual heat losses will directly contribute to the measurement error. Instead, a change can be implemented in which all columns and probes are sunk into a second heating stage with separately controlled heaters. This second stage can be set to the nominal temperature of the initial heating stage so that there will be a minimal temperature difference between the two stages. Combined with traditional usage of low cross-sectional areas, large lengths, and low thermal conductivity materials, this can help reduce the errors to acceptable degrees.

While convective losses are not an issue due to the common usage of vacuums, radiation losses can still cause large problems with thermal conductivity estimation even with radiation shields in place. This is a greater problem in high temperature measurements, due to the effects of the fourth-power terms for radiative heat transfer. Two steps can be taken to alleviate these errors. First, the radiation shield temperature can be set at the nominal temperature of the sample hot side, rather than being fixed at the average temperature or at approximately similar temperatures. This requires more accurate control of the radiation shield temperatures as well as the temperature changing with the hot side temperature as the temperature drop is increased for more measurements. It does, however, significantly reduce radiation losses from the hot side. Even when the radiation shield is set at the nominal hot side temperature, there will be some temperature variation, and therefore radiative losses. This can be further reduced by having the radiation shield be made of a low-emissivity material, for a passive shielding effect.

Another finite element analysis was run utilizing such modifications. Once again, a silicon dioxide pellet sample was modeled with diameter of 12.7 mm and a height of 5 mm. It was then placed between two tungsten heat spreaders with matching radius and a heights of 40 mm each. Tungsten was chosen for its relatively low emissivity as well as its high melting point. Two sheets of 0.25 mm thick Grafoil® with matching diameters were once again placed between the heat spreaders and the sample. Three rectangular heating cartridges with dimensions of 3.00 mm by 30.0 mm by 1.70 mm were placed into both heat spreaders. The central thermocouple with mullite tubing remained the same, except chromel was replaced with a tungsten lead. Three hollow supporting columns with outer diameter of 3.175 mm and inner diameter of 1.422 mm were placed on the ends of both heat spreaders. Wires with 0.2 mm diameter were used for the various electrical leads and control probe leads, and all wires and supports were cut off 25 mm away from the edges of the heat spreaders.

Both the electrical leads and the supporting columns were also assumed to be made of tungsten. The entire model was then cut with a bilateral symmetry.

The simulation was run for base temperatures of 100° C., 300° C., 500° C., 800° C., and 1000° C. The support ends and wire ends for the hot side were set at 5° C. higher than the base temperature assuming they were sunken into the second stage heating platform, while cold ends were set at 22° C. The bisected surfaces were assumed to be adiabatic due to symmetry. All other exposed surfaces were set with radiation with surrounding temperatures matching the hot-side temperature. The heaters both above and below were then adjusted to produce a temperature drop from the hot-side temperature to the base temperature at the center of the sample. It was assumed that the wires and supporting columns were electrically insulated enough for an open circuit condition, and therefore any thermoelectric effects were ignored. The same material properties were used as the previous simulation, with an addition of tungsten taken from the Thermophysical Properties of Matter handbooks. In addition, the emissivities were adjusted to estimate the emissivity of the surrounding radiation shield by using a form factor of the form $$\varepsilon_{\text{effective}} = \cfrac{1}{\cfrac{1}{\varepsilon_{\text{surface}}} + \cfrac{r_i}{r_o}\left(\cfrac{1}{\varepsilon_{\text{shield}}} - 1\right)}, \quad (c)$$

For the simulation, the ratio of radii were set at 0.7. The apparatus was then discretized into 690,125 elements and solved using Mechanical APDL non-linear iterative solver The heater output was compared to the averaged-heat flux down the sample in Table B. As expected, there is a tendency for there to be some heat loss from the upper heaters, and therefore the heat flux will be overestimated from 2% at low temperatures and up to 7.6% at 1000° C. There is, however, a competing effect from the radiation on the sample itself which tends to increase the heat flux along the edges of the sample, especially in the lower half. This effect can be seen in FIGS. 25 and 26 at both 300° C. and 1000° C., respectively. Due to the fourth power present in radiative heat transfer, the effect is about an order of magnitude bigger in scale at 1000° C. nominal temperature. The heat flux, however, remains more stable at the centers of the sample. Instead, the steepest increases in the heat fluxes are mostly in the bottom edges, where they will have the lowest amount of impact on the measurement since it will have the least time to affect the temperature gradient, and the measurement is done at the center. Table B also includes an average over the top surface of the sample, before the radiation on the sample can take effect. This shows that, without the competing effect, the heat flux is overestimated from 2.1% at 100° C. to 7.6% at 1000° C. Since the heater losses are greater than the sample gains, higher emissivity samples as well as slightly larger temperature gradients should be tolerable without increasing the error. The thermal conductivity that would be measured in this case was calculating using equation (b) and was compared with the input conductivity to obtain a relative error, as listed in Table 1 previously. This was compared to the error propagated from the temperature probe error mentioned previously as well as the error between the input heat and the surface average. The two were found to be mostly in agreement, varying by at most 0.56% at 1000° C. Once again, the errors tended to overestimate the thermal conductivity, with minimum of 2.2% at 100° C. and 8.22% at 1000° C. From the propagated error, it can be seen that the heat flux is the dominant error source in the system.

TABLE B

Average heat flux through the heater and sample

| Temperature (° C.) | 100 | 300 | 600 | 800 | 1000 |
|---|---|---|---|---|---|
| Heater output (W/m$^2$) | 1531.5 | 1721.5 | 1822.9 | 1973.2 | 2074.5 |
| Full sample surface average (W/m$^2$) | 1499.4 | 1693.0 | 1785.9 | 1888.0 | 1916.0 |
| Top sample surface average (W/m$^2$) | 1499.0 | 1689.0 | 1771.8 | 1834.0 | 1809.0 |

We now present a modified apparatus design for direct thermal conductivity measurement at an ultra-high temperature of 2500° C. The capability for direct thermal conductivity measurements at ultra-high temperature ranges above 1500° C. and even 2000° C. can be quite beneficiary from a quality-control stand point for technologies operating at extreme temperatures. A modified design for thermal conductivity measurement at 2500° C. is discussed here. The tungsten-niobium thermocouple wires design can be replaced with a tungsten-5% rhenium versus tungsten-26% rhenium combination (or any other suitable thermocouple configuration). Such configuration is commercially available from OMEGA Engineering with an upper operating limit of 2760° C. The alumina tubing (melting point ~2070° C.) is replaced with hafnium oxide (HfO$_2$) with a melting temperature of ~2810° C. The heat spreaders and the radiation shield are assumed to be made of tungsten (melting point ~3380° C.). Therefore, the only materials used in the proposed instruments design for ultra-high temperature applications are tungsten, hafnium oxide (melting point ~2810° C.) and tungsten-rhenium alloys (operating up to 2760° C.). The sample is assumed to be made of boron nitride (melting point 3000° C.) with a dimension of 12.7 mm in diameter and 5 mm in height. All the materials properties were adopted from the Thermophysical Properties of Matter handbooks. The first challenge in this case is to create a temperature gradient across the sample. Because the proportionality of the radiation heat flux with the fourth power of temperature, even a small temperature difference creates a considerable flux from/to the radiation shield making temperature control challenging. To have better control over the temperature gradient from the sample, the radiation shield is split into two sections, i.e. having a top and bottom shield with separate temperature control feedbacks. In practice, this can be made of two shields with embedded cartridge heaters each one covering half of the height of the instrument. Thermocouples need to be embedded in these shields for separate temperature controls. The temperature of the radiation shield for the bottom half and the bottom heater power are used in order to control the temperature gradient between the top and bottom surface of the sample. Table C lists the heater powers and the temperature set points for top and bottom radiation shield. A temperature gradient of 4.4° C. between the hot and cold sides of the sample is calculated for the heater power values and radiation shield temperature setpoints listed in Table C. The performed analysis reveals an error of −17.15% the thermal conductivity measurement of the sample at an average temperature of 2497.8° C.

TABLE C

| Model Conditions and Uncertainty Analysis at ~2500° C. | Value |
| --- | --- |
| Top heat spreader heater power (W m$^{-3}$) | 4,000,000 |
| Bottom heat spreader heater power (W m$^{-3}$) | 1,000,000 |
| Sample top surface center temperature (° C.) | 2,500.04 |
| Sample bottom surface center temperature (° C.) | 2,495.63 |
| Radiation shield upper half set temperature (° C.) | 2,502 |
| Radiation shield lower half set temperature (° C.) | 2,490 |
| Temperature difference error (%) | 4.87 |
| Sample top surface average heat flux (W/m$^2$) | 14,094.415 |
| Heater output on the top sample surface (W/m$^2$) | 14,481.845 |
| Heat flux error (%) | 2.74 |
| Propagated thermal conductivity error (%) | 5.6 |
| Direct thermal conductivity error (%) | −17.15 |

Table C shows the thermal conductivity error propagated from the temperature probe error and obtained as the error between the input and the surface average heat flux for a boron nitride sample at about 2500° C.

FIGS. 9A-9D and 10A-10D show temperature distributions across the sample diameter at the top and bottom surfaces as a variation from the sample center temperature at nominal operating temperatures of 900° C. and 2500° C. respectively. The maximum temperature variation was calculated to be less than 0.233° C. The temperature distribution of the instrument is shown in FIG. 24*d*. An average heat flux of 8,946,149.2 Wm$^{-2}$ was calculated on the support ends and wire ends at the bottom (cooled side) of the instrument. This value determines the overall flux that is needed to be removed from the instrument. This value can be controlled by changing the temperature of the bottom shield as well as the lower heat spreader cartridge heaters.

Radiation loss from the top heat spreader to the radiation shield is a major contribution to the uncertainty of the thermal conductivity measurements. The challenge is that due to the thermal resistance on the top heat spreader, there exists a temperature gradient of ~2° C. along the heat spreader itself. In such ultra-high temperature ranges, even, the smallest temperature difference between the top heat spreader and the top radiation shield can cause a major heat loss/gain. Thus, even though the radiation shield is set at the average temperature of the heat spreader, the heat loss is still considerable due to the fact that the top heat spreader is not a constant temperature surface. Two solutions can be proposed in order to suppress such a heat loss: the first one is to use a material with a very high thermal conductivity for the heat spreader design. Having a high thermal conductivity material reduces the thermal resistance along the heat spreader, thereby the temperature gradient. There are, however, few machinable candidates suitable for such a high temperature ranges, and tungsten seems to be indeed a proper choice. The other solution is to design multi-stage top radiation shield. For the single shield, the temperature was set to 2502° C. (average temperature of the heat spreader). For the double-stage shield, the temperatures were set to 2502.1 and 2500.9° C. for the first and second stage, respectively. The error analysis for the double-stage shield has been listed in Table E below. It can be seen that the thermal conductivity measurement error of −17.15% for a single-stage radiation shield can be reduced to −13.31% by using a double-stage shield. An ideal situation is to use multiple stages depending on the height and temperature gradient of the heat spreader. A simpler alternative is to use a radiation shield with an optimum thickness in order to create a similar temperature gradient along the shield and the heat spreader as they both are made of the same material i.e. tungsten.

TABLE D

| Model Conditions and Uncertainty Analysis at ~2500° C. with 2 Thermal Guards | Value |
| --- | --- |
| Top heat spreader heater power (W m$^{-3}$) | 4,000,000 |
| Bottom heat spreader heater power (W m$^{-3}$) | 1,000,000 |
| Sample top surface center temperature (° C.) | 2,499.489 |
| Sample bottom surface center temperature (° C.) | 2,495.27 |
| Radiation shield stage #1 upper set temperature (° C.) | 2,502.12 |
| Radiation shield stage #2 upper set temperature (° C.) | 2,500.9 |
| Radiation shield lower half set temperature (° C.) | 2,490 |
| Temperature difference error (%) | 4.24 |
| Sample top surface average heat flux (W/m$^2$) | 13,983.44 |
| Heater output on the top sample surface (W/m$^2$) | 14,481.845 |
| Heat flux error (%) | 3.56 |
| Propagated thermal conductivity error (%) | 5.5 |
| Direct thermal conductivity error (%) | −13.31 |

Table D shows the thermal conductivity error propagated from the temperature probe error, and as the error between the input and the surface average heat flux for a boron nitride sample at about 2500° C. with a two-stage top radiation shield.

In order to complete the figure of merit measurement, it is also necessary to obtain the electrical conductivity. The usage of tungsten with relatively high electrical conductivity means that it can be also used as a junction for electrical current. By using the same voltage probes as for Seebeck coefficient measurements and running a known amount of current through the heat spreaders and the sample, it is possible to obtain electrical resistivity. This, however, will produce an error in voltage readings as the current flows around the thermocouple insertion holes, similar to the previous errors in temperature readings.

A finite element analysis was run with the same model as in the thermal conductivity analysis excluding the support column, which was assumed to be electrically insulated from rest of the system, and it was not bisected. Three axis-symmetric electrical leads were used with a total input electrical current of 1 A, and another set of similar electrical leads were set with output of 1 A. A reference voltage of 0 V was chosen near the surface of the sample. The electrical resistivity for materials were set at their room-temperature values, with the sample resistivity at $10^{-4}$ Ω-m. It was then discretized into 1,046,698 elements and solved with a Mechanical ADPL solver.

Figure 13:
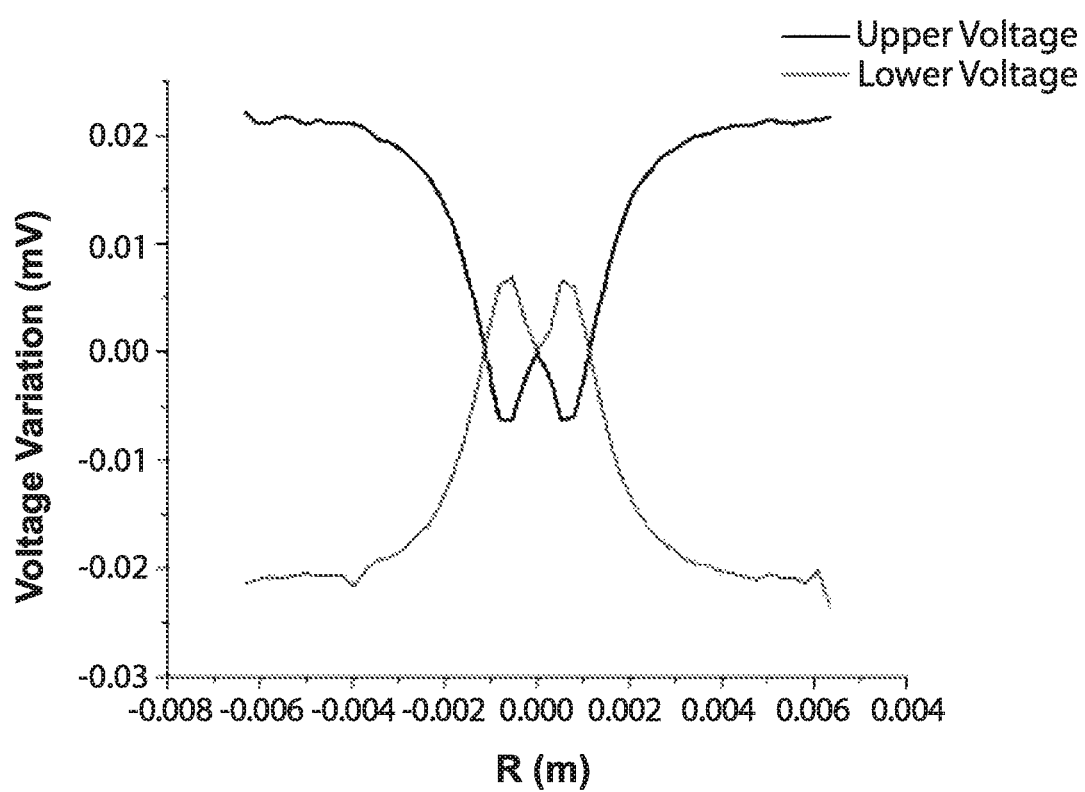
FIG. 13 shows a chart of resulting voltage distribution.

The resulting voltage distribution can be seen in FIG. 13. There is an overall tendency to underestimate the voltage difference, as the current must flow around the electrically insulating mullite tubing of the thermocouple leads. This causes there to be a hole in the electrical junction at the center, and the current must flow horizontally on the sample surface causing a voltage variation. Some of this is relieved by the presence of the Grafoil® with its relatively high in-plane electrical conductivity, as well as the niobium and tungsten tip of the thermocouple itself. The effects of the thermocouple tip can be seen by the rebound in voltage variations at the center in FIG. 15, as the voltage spreads to be more uniform. The minimum and maximum voltage drops were compared with the voltage drop at sample centers, resulting in errors of −1.06 and +1.76% in the electrical conductivity, respectively.

While the errors caused by the parasitic losses and uneven temperature/voltage distribution can have significant effects, there are other sources of uncertainty to consider. Both the thermal and electrical conductivity measurements are affected by the geometry variation of the sample. Using a measurement tool such as a caliper, the uncertainty can be assumed to be ±0.01 mm for both the diameter and the height, with the uncertainty in diameter having a larger impact due to its square term in the cross-sectional area. Although this uncertainty can only be reduced further with more complex measurement instruments, the relative uncertainty of the height can be decreased by utilizing longer samples. This will also have the effect of requiring larger heater outputs at the same temperature settings, thereby reducing the relative uncertainty from parasitic losses. It will, however, increase the radiative effects on the sample sides and the related errors. The sample diameter cannot be increased, as it will cause the two junctions to be too small for the sample. In addition, there is the possibility of sample deformities depending on the preparation methods used. While the sample radius is mostly uniform in a pellet press, the sample height can vary if the top or the bottom surface is sloped. While this can vary greatly depending on sample preparation methods used, here it is assumed to be around 0.1 mm/cm. The thermal and electrical conductivity, however, has the same geometry factors which cancel out in the calculation for the figure of merit. Therefore this source of error can be ignored for the overall figure of merit, although not the individual properties.

Further uncertainty is present depending on the data acquisition units and measurement probes used. Depending on the quality and the maintenance of the data acquisition unit used, there will be some inherent measurement uncertainty. Using a multi-meter and a power source from Keithley for the estimation, this can be approximated at ±(0.005%+1 µV) for the voltage measurement and ±(0.05%+0.5 mA) for the current output. In addition, the PID controller used for the heaters will also have an error, estimated at ±(0.01%+0.12 µA) for the output current using Lake Shore as reference, with heater resistance at total of 15Ω. In addition, the Seebeck coefficients of the thermocouple wires used can produce additional errors depending on how well it matches the calibration data used. The calibration used for the wires will have an inherent uncertainty, which will affect the temperature measurements. In addition, it will affect the voltage measurements when the wire Seebeck effects are being subtracted, depending on the temperature drop of the Seebeck measurement and the voltage lead Seebeck coefficient. If the wire Seebeck variation is estimated at ±5%, then the voltage error on a 10° C. temperature drop Seebeck measurement using niobium leads will be ±0.62 µV at ~1000° C.

Due to the differential nature of the properties measured, the effects of offsets and drift can be reduced by using gradients. This, however, presents a statistical error in the form of $$U_{slope} = t_{N-2, 95\%} \sqrt{\frac{\sum (y_i - \hat{y}_i)^2}{(N-2) \sum (x_i - \hat{x}_i)^2}} \quad (d)$$

with a confidence level of 95%. This will directly affect the uncertainty of all three measurements, therefore has a large impact on the overall figure of merit uncertainty. Increasing the sample size, however, will decrease the overall level of uncertainty. By utilizing large number of data points with varying temperature or voltage drops, this uncertainty can be forced down into more negligible levels.

The additional thermal and electrical resistance contributed by both the thin sheet of Grafoil® and the contact resistances will also generate additional error. Using same geometry and product specifications as in the FEA, this will result in additional thermal impedance of 0.00017 m²-K/W and electrical impedance of 0.12 Ω-m², neither of which are negligible values. These values can be reduced by using thinner sheets of Grafoil®, using a material with better through-plane conductivities, or by foregoing the interface material. Using thinner sheets or foregoing the material, however, will cause a larger temperature and voltage variation at the center hole. In addition, foregoing the sheets will increase the contact resistances instead. As an alternative solution, multiple samples of different lengths can be used along with a differential method to bypass the additional resistances altogether. This will introduce errors in Equation (e) instead, which can then be reduced by using more samples, although this will significantly increase the overall measurement time. To avoid this, the instrument can instead be calibrated in this fashion to subtract these additional impedances from future measurements.

Each property error presented in this section are assumed to be linearly independent. Their relative errors are combined using $$U_{total} = \sqrt{U_a^2 + U_b^2 + U_c^2 + \ldots} \quad (e)$$

The property errors are also recalculated without the geometry errors and combined using $$U_{ZT} = \sqrt{U_\sigma^2 + U_\kappa^2 + 4 U_S^2}. \quad (f)$$

The sources of errors and their values are summarized in Table E, and Table 2 previously. The property errors are also calculated using the assumption of 12.7 mm diameter and 5 mm height cylindrical samples, currents in order of magnitude of amperes, and voltages in the order of magnitude of millivolts, although the exact numbers will vary depending on the sample. In addition, the temperature variation and parasitic losses were set at 1000° C. as calculated previously. The error on the thermal conductivity is primarily dominated by the parasitic losses on the floor and the sample geometry on the ceiling. Electrical conductivity follows the opposite trend, in which the sample geometry dominates for the ceiling and the voltage variation dominates for the ceiling. Since the uncertainty in the sample geometry is canceled out for the figure of merit, however, the thermal and electrical conductivity contribution to the figure of merit uncertainty is large for the ceiling but negligible for the floor. Instead, the floor of the figure of merit is dominated by the Seebeck coefficient, which has errors primarily caused by the temperature variation and magnified by the square factor. The errors in the probes and controllers are also found to be negligible compared to the errors found in the calculations done in previous sections.

TABLE E

| Source of error | Value |
| --- | --- |
| Sample geometry | ±1.03% |
| Voltage variation | −0.34% to +1.17% |
| Multimeter voltage | ±(0.005% + 1 μV) |
| Multimeter current | ±(0.05% + 0.5 mA) |
| Seebeck variation | ±0.62 μV |
| Temperature variation | ±0.65% |
| Heater output power | ±(0.01% + 0.12 μA) |
| Parasitic thermal losses | −7.64% |

A finite element analysis was employed in order to estimate the uncertainty in the Seebeck coefficient in the Snyder design at 3.06% to 2.24% at a ΔT=10° C. from temperature ranges of 500° C. to 900° C. This error was found to be caused not by the cold finger effect, but instead due to temperature variations on the sample surface caused by the hole in the probe insertion point. A modified design was then presented (this invention) in order to both reduce parasitic losses for a thermal conductivity measurement as well as to allow an electrical conductivity measurement from room temperature up to 2500° C. The parasitic losses in the modified design was estimated to be around 7.64% at 1000° C. In addition, a similar effect to the temperature variation on the sample surface was found for the voltage variation during electrical conductivity measurements, which would range from −1.06% to +1.76%. Overall the uncertainty in the figure of merit with this instrument has been calculated to be −8.37% to +8.87% at ~1000° C., with the parasitic losses and the temperature variation playing the largest roles, which is within an acceptable range.

Figure 11:
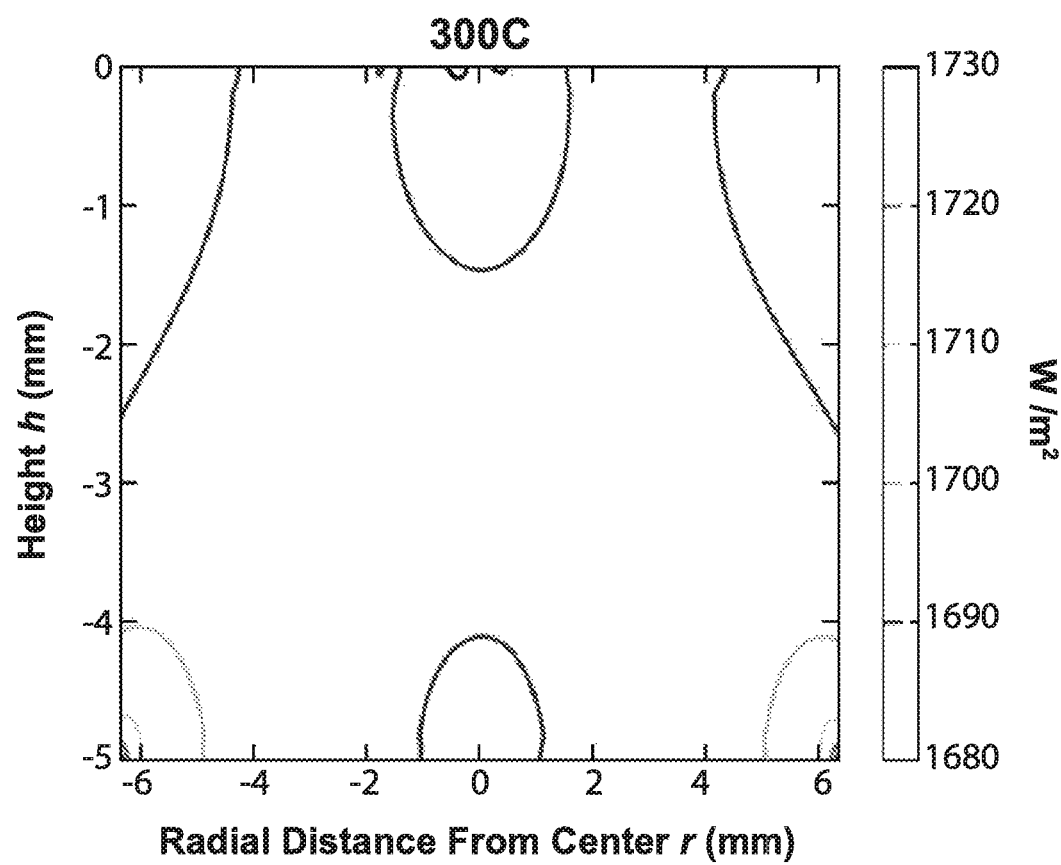
FIGS. 11 and 12 indicate competing effect from the radiation on the sample itself which tends to increase the heat flux along the edges of the sample, at both 300° C. and 1000° C. respectively.
Figure 12:
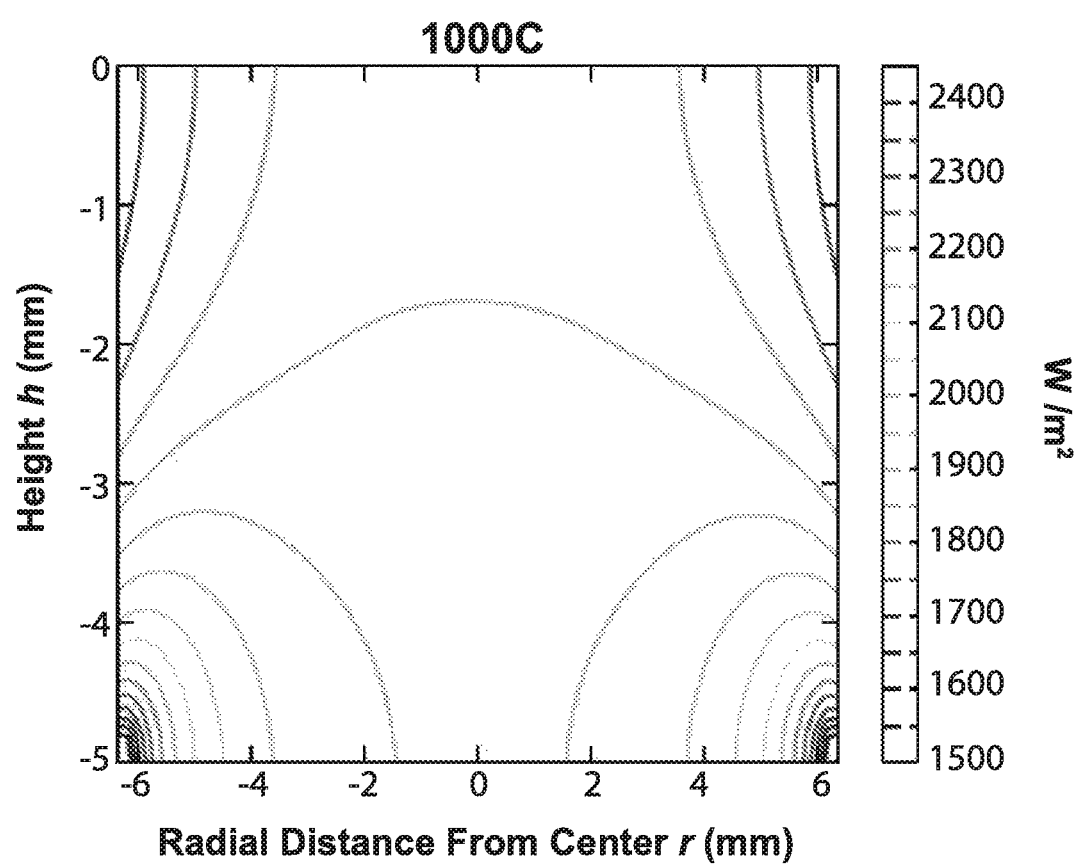

FIGS. 11 and 12 indicate competing effect from the radiation on the sample itself which tends to increase the heat flux along the edges of the sample, at both 300° C. and 1000° C., respectively. FIG. 13 shows a chart of resulting voltage distribution.

As described above, certain embodiments include an instrument for accurate high-throughput characterization of electrical, thermal, electrochemical, and thermoelectric properties. Any suitable combinations and of any suitable embodiments and/or portions thereof is contemplated herein. Any singular can be a plural and any plural can be a singular as appreciated by those having ordinary skill in the art in view of this disclosure.

The methods and systems of the present disclosure, as described above and shown in the drawings, provide for improved material property measurement instruments with superior properties. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A device for measuring a plurality of material properties, comprising:
   a structure and sensors in the structure configured to sense at least thermal conductivity, electrical conductivity, and Seebeck coefficient for a single sample consecutively while maintaining a vacuum or inert gas environment,
   wherein the structure includes a thermal guard disposed around the sensors with three feedback controlled zones which allows for reduction and/or elimination of parasitic heat loss channels, and the structure includes a plurality of metallic heat spreaders,
   wherein the heat spreaders include an upper heat spreader and a lower heat spreader, wherein the sample can be placed between the upper heat spreader and the lower heat spreader,
   wherein the heat spreaders further include thermocouples, and axial thermocouples are disposed within the heat spreaders to be in thermal communication with the sample,
   wherein one or more of the axial thermocouples and/or the heat spreaders can be spring-loaded to ensure contact pressure is maintained with the sample over a wide range of temperatures, and
   wherein the lower heat spreader includes a cylindrical base and a co-axial cylindrical extrusion on top of a smaller diameter than the cylindrical base.

2. The device of claim 1, wherein the sensors are configured to sense at least one of ionic conductivity and/or surface temperatures.

3. The device of claim 1, wherein the device is configured for correlation of property evolution with thermal processing history of the sample.

4. The device of claim 1, further comprising a plurality of cartridge heaters embedded into the cylindrical base in a horizontal, radially symmetric configuration above the bottom of the base.

5. The device of claim 1, wherein the upper heat spreader includes a plurality of cartridge heaters arranged symmetrically about the upper heat spreader axis.

6. The device of claim 1, wherein the heat spreaders are configured to apply current and to measure voltage, and the thermocouples for measuring voltage drop across the sample.

7. The device of claim 1, wherein one or more sheets of thermally conductive film can be placed in between the two heat spreaders and the sample in order to further ensure good contact.

8. A method comprising the step of, measuring any suitable plurality of thermal conductivity, electrical conductivity, Seebeck coefficient, and surface temperature of a sample consecutively without using multiple instruments and without moving the sample and using the device of claim 1.

9. The method of claim 8, wherein measured thermovoltage and Seebeck coefficient of a reference sample are used to determine a calibration coefficient linking a thermocouple probe temperature to the intrinsic temperature at a top of the sample.

* * * * *